(12) United States Patent
Kim et al.

(10) Patent No.: US 12,356,802 B2
(45) Date of Patent: Jul. 8, 2025

(54) DISPLAY DEVICE

(71) Applicant: Samsung Display Co., Ltd., Yongin-Si (KR)

(72) Inventors: Keun Woo Kim, Seongnam-si (KR); Tae Wook Kang, Seongnam-si (KR); Jae Seob Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 384 days.

(21) Appl. No.: 17/721,525

(22) Filed: Apr. 15, 2022

(65) Prior Publication Data

US 2023/0063106 A1 Mar. 2, 2023

(30) Foreign Application Priority Data

Aug. 26, 2021 (KR) ........................ 10-2021-0113262

(51) Int. Cl.
*H10K 59/121* (2023.01)
*H10K 59/12* (2023.01)
*H10K 59/131* (2023.01)

(52) U.S. Cl.
CPC ..... *H10K 59/1216* (2023.02); *H10K 59/1201* (2023.02); *H10K 59/131* (2023.02)

(58) Field of Classification Search
CPC .......... H10K 59/1216; H10K 59/1201; H10K 59/131; H10K 59/1213; H10K 59/121; H10K 59/10–221; H10K 50/00–88; H10K 59/00–95; H10K 71/00–861; H01L 27/1237; H01L 27/1255; H01L 27/1251
See application file for complete search history.

(56) References Cited

U.S. PATENT DOCUMENTS

| 2015/0263079 | A1* | 9/2015 | Ko ...................... H01L 27/1259 257/306 |
| 2016/0216570 | A1* | 7/2016 | Yang ................. G02F 1/134309 |
| 2021/0280652 | A1 | 9/2021 | Kim et al. |

FOREIGN PATENT DOCUMENTS

| CN | 112614870 A | * | 4/2021 | ......... H01L 27/1218 |
| KR | 10-2013-0060140 A | | 6/2013 | |

(Continued)

OTHER PUBLICATIONS

B. Chen, et al., Systematic Analysis of High-Current Effects in Flexible Polycrystalline-Silicon Transistors Fabricated on Polyimide. 0018-9383 © 2017 IEEE (IEEE Transactions on Electron Devices, pp. 1-7).

(Continued)

*Primary Examiner* — Shahed Ahmed
(74) *Attorney, Agent, or Firm* — Innovation Counsel LLP

(57) ABSTRACT

The present disclosure relates to a display device which includes: a substrate; a semiconductor layer disposed on the substrate and including a driving transistor and a second transistor each of which including a channel, a first region, and a second region; a first gate insulating layer disposed on the semiconductor layer, a gate electrode of the second transistor disposed on the first gate insulating layer and overlapping the channel of the second transistor; a second gate insulating layer disposed on the gate electrode of the gate electrode of the second transistor; and a gate electrode of the first driving transistor disposed on the second gate insulating layer and overlapping the channel of the driving transistor.

19 Claims, 26 Drawing Sheets

(56) References Cited

FOREIGN PATENT DOCUMENTS

| | | |
|---|---|---|
| KR | 10-2017-0020571 A | 2/2017 |
| KR | 10-2019-0080207 A | 7/2019 |
| KR | 10-2021-0113513 A | 9/2021 |

OTHER PUBLICATIONS

K. Kim, et al., Improvement of hot carrier instability on small-dimension polycrystalline TFTs in flexible AMOLED displays, (IMID 2020 Digest, p. 1).

* cited by examiner

DISPLAY DEVICE

CROSS-REFERENCE TO RELATED APPLICATION

This application claims priority to and the benefit of Korean Patent Application No. 10-2021-0113262 filed in the Korean Intellectual Property Office on Aug. 26, 2021, the entire contents of which are incorporated herein by reference.

BACKGROUND

1. Field

The present disclosure relates to a display device.

2. Description of the Related Art

A display device is a device that displays an image, and includes a liquid crystal display (LCD), an organic light emission diode (OLED), and the like. The display device is used in various electronic devices such as a mobile phone, a navigation device, a digital camera, an electronic book, a portable game machine, and various terminals.

The organic light emission diode (OLED) display includes two electrodes and an organic emission layer disposed therebetween, and electrons injected from one electrode and holes injected from the other electrode are coupled with each other on the organic emission layer to form excitons and the excitons emit light while emitting energy.

Such an organic light emission diode display includes a plurality of pixels including an organic light emission diode which is a self-emissive device, and in each pixel, a plurality of transistors for driving the organic light emission diode and at least one storage capacitor are formed. The plurality of thin film transistors basically include a switching thin film transistor and a driving thin film transistor.

Such a plurality of thin film transistors include a gate insulating layer disposed between a semiconductor and a gate electrode, and characteristics of the thin film transistor may be affected by the thickness of the gate insulating layer. Also, the thickness of the gate insulating layer for optimizing the characteristic of the switching transistor and the characteristic of the driving transistor may be different.

The above information disclosed in this Background section is only for enhancement of understanding of the background of the described technology, and therefore it may contain information that does not form the prior art that is already known in this country to a person of ordinary skill in the art.

SUMMARY

Exemplary embodiments are to provide a display device capable of optimizing a characteristic of a switching transistor and a characteristic of a driving transistor, respectively.

A display device according to an exemplary embodiment includes: a substrate; a semiconductor layer disposed on the substrate and including a channel, a first region, and a second region of a driving transistor, and a channel, a first region, and a second region of a second transistor; a first gate insulating layer disposed on the semiconductor layer; a gate electrode of the second transistor disposed on the first gate insulating layer and overlapping the channel of the second transistor; a second gate insulating layer disposed on the gate electrode of the gate electrode of the second transistor; and a gate electrode of the driving transistor disposed on the second gate insulating layer and overlapping the channel of the driving transistor.

The driving transistor may include a first driving transistor and a second driving transistor serially connected to each other, each of the first driving transistor and the second driving transistor including a gate electrode, a channel, a first region and a second region.

The second gate insulating layer may be disposed between the gate electrode of the first driving transistor and the channel of the first driving transistor, and is not disposed between the gate electrode of the second driving transistor and the channel of the second driving transistor, and between the gate electrode of the second transistor and the channel of the second transistor.

A thickness of a gate insulating layer disposed between the gate electrode of the second driving transistor and the channel of the second driving transistor may be less than a thickness of a gate insulating layer disposed between the gate electrode of the first driving transistor and the channel of the first driving transistor.

The thickness of a gate insulating layer disposed between the gate electrode of the second transistor and the channel of the second transistor may be less than the a thickness of a gate insulating layer disposed between the gate electrode of the first driving transistor and the channel of the first driving transistor.

The thickness of a gate insulating layer disposed between the gate electrode of the second transistor and the channel of the second transistor may be the same as the thickness of the gate insulating layer disposed between the gate electrode of the second driving transistor and the channel of the second driving transistor.

The first gate insulating layer may include a lower first gate insulating layer disposed on the semiconductor layer and an upper first gate insulating layer disposed on the lower first gate insulating layer.

The upper first gate insulating layer and the second gate insulating layer may include the same material.

The lower first gate insulating layer may include a silicon oxide and the upper first gate insulating layer and the second gate insulating layer may include a silicon nitride.

The upper first gate insulating layer and the second gate insulating layer may be formed through different process conditions.

A thickness of the upper first gate insulating layer may be thinner than a thickness of the lower first gate insulating layer.

The ratio of the thickness of the upper first gate insulating layer to the thickness of the lower first gate insulating layer may be 0.2 or more and 0.8 or less.

The thickness of the equivalent oxide film of the first gate insulating layer may be 800 Å or more and 1400 Å or less.

The thickness of the second gate insulating layer may be 1200 Å or more and 1800 Å or less.

The display device according to an exemplary embodiment may further include: a first storage electrode connected to the gate electrode of the second driving transistor; a second storage electrode disposed on the second gate insulating layer and overlapping the first storage electrode; and a third storage electrode disposed on the second gate insulating layer and overlapping the gate electrode of the second driving transistor, and the semiconductor layer may further include a capacitor region overlapping the first storage electrode.

The first storage electrode may be disposed on the same layer as the gate electrode of the second driving transistor and the second storage electrode and the third storage electrode may be disposed on the same layer and are formed integrally.

The channel, the first region, and the second region of the first driving transistor, the channel, the first region, and the second region of the second driving transistor, and the channel, the first region, and the second region of the second transistor may be integrally formed and separated from the capacitor region.

The display device according to an exemplary embodiment mar further include: an interlayer insulating layer disposed on the second storage electrode and the third storage electrode; and a driving voltage line and a connection electrode disposed on the interlayer insulating layer, wherein the driving voltage line may be connected to the second storage electrode, the third storage electrode, and the capacitor region, and the connection electrode may be connected to the gate electrode of the first driving transistor and the gate electrode of the second driving transistor.

A display device according to an exemplary embodiment includes: a substrate; a semiconductor layer disposed on the substrate and including a channel, a first region, and a second region of a driving transistor, and a channel, a first region, and a second region of a second transistor; a first gate insulating layer disposed on the semiconductor layer; a gate electrode of the second transistor disposed on the first gate insulating layer and overlapping the channel of the second transistor; a second gate insulating layer disposed on the gate electrode of the second transistor; and a gate electrode of the driving transistor disposed on the second gate insulating layer and overlapping the channel of the driving transistor.

The display device may further include a third gate insulating layer disposed on the gate electrode of the driving transistor and a storage electrode disposed on the third gate insulating layer and overlapping the gate electrode of the driving transistor. A thickness of a gate insulating layer disposed between the gate electrode of the second transistor and the channel of the second transistor may be less than a thickness of a gate insulating layer disposed between the gate electrode of the driving transistor and the channel of the driving transistor.

The first gate insulating layer may include a lower first gate insulating layer disposed on the semiconductor layer, and an upper first gate insulating layer disposed on the lower first gate insulating layer, and the upper first gate insulating layer and the second gate insulating layer may include the same material.

According to exemplary embodiments, an off current of the switching transistor of the display device may be reduced and an operating range of the driving transistor may be increased.

DETAILED DESCRIPTION

Figure 1:
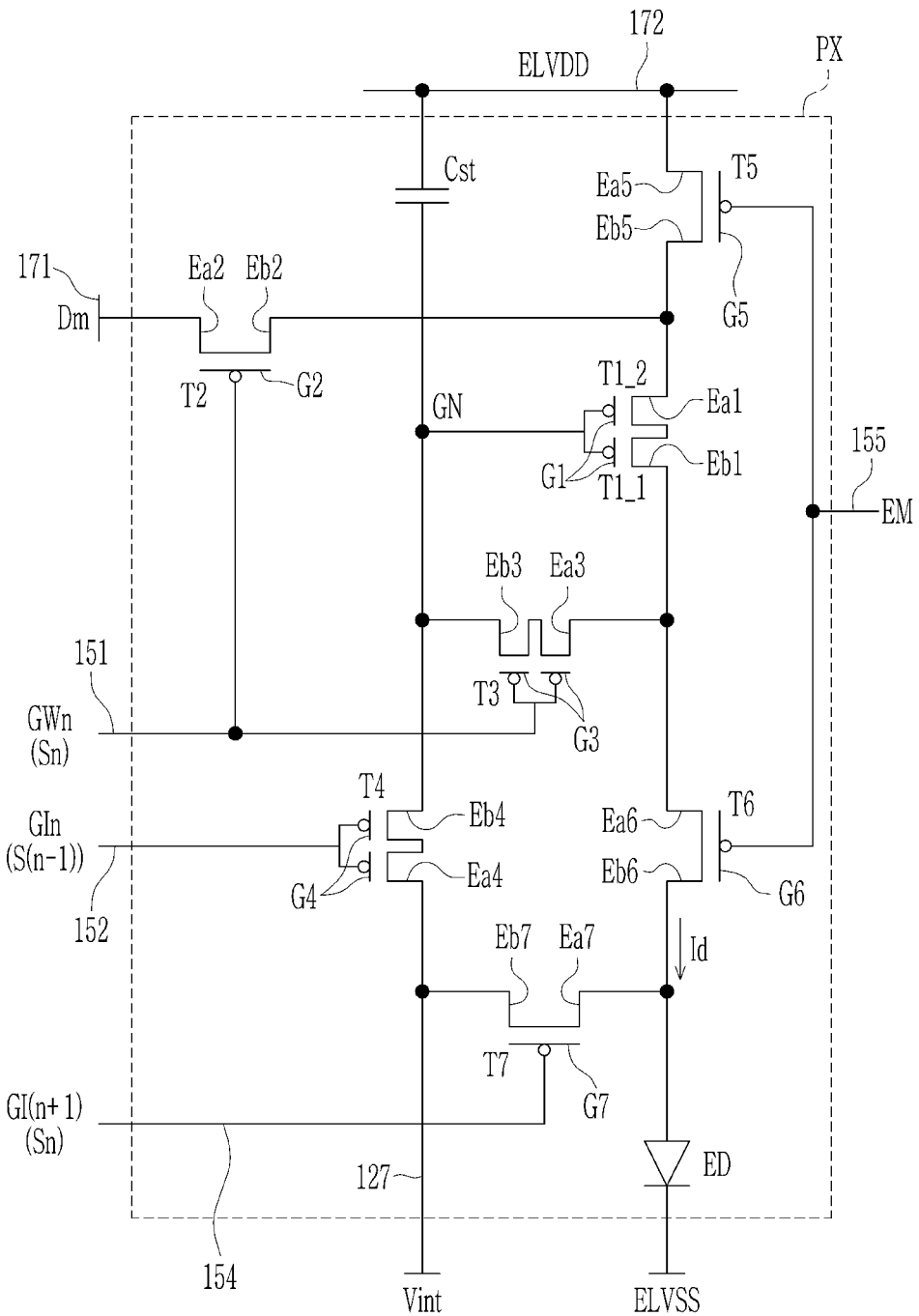
FIG. 1 is a circuit diagram of one pixel of display device according to an exemplary embodiment.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "in a plan view" means viewing the object portion from the top, and the phrase "on a cross-section" means viewing a cross-section of which the object portion is vertically cut from the side.

First, a display device according to an exemplary embodiment is described with reference to FIG. 1 to FIG. 11 as follows.

Figure 2:
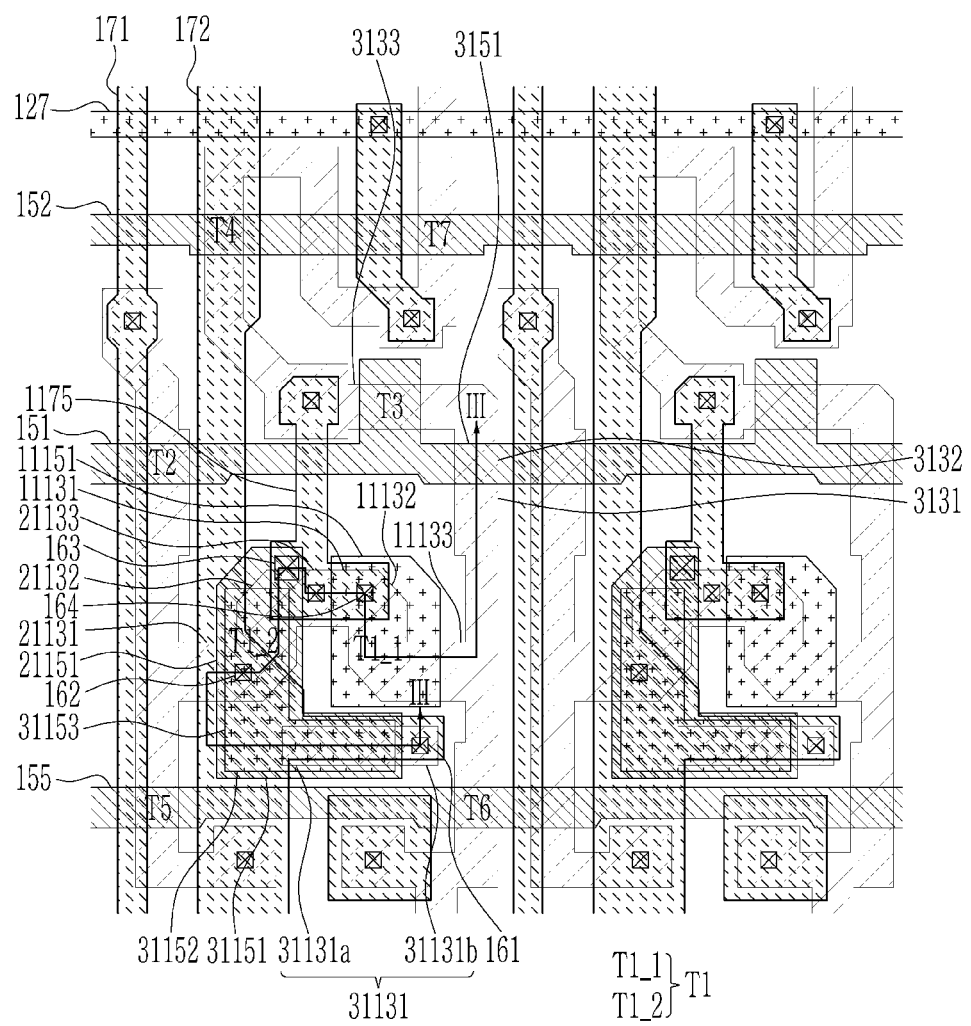
FIG. 2 is a top plan view of a display device according to an exemplary embodiment.
Figure 3:
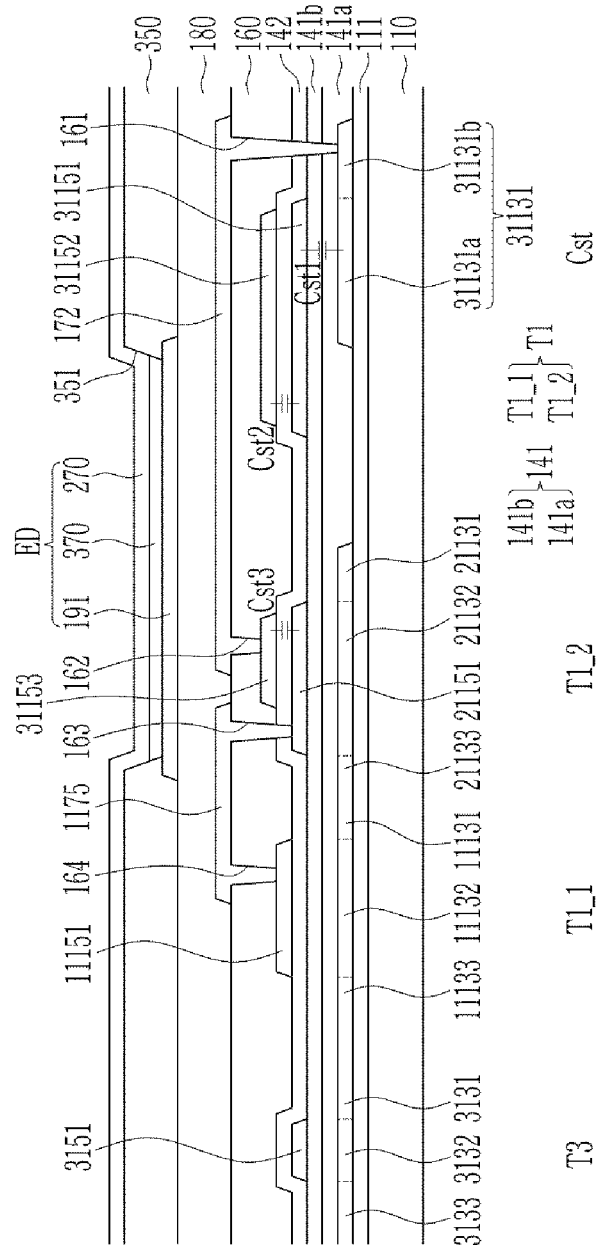
FIG. 3 is a cross-sectional view of a display device according to an exemplary embodiment taken along a line III-III of FIG. 2.

FIG. 1 is a circuit diagram of one pixel of display device according to an exemplary embodiment, FIG. 2 is a top plan view of a display device according to an exemplary embodiment, and FIG. 3 is a cross-sectional view of a display device according to an exemplary embodiment taken along a line III-III of FIG. 2. FIG. 2 shows two adjacent pixels, and two adjacent pixels may have substantially the same structure. However, the present inventive concept is not limited thereto, and two adjacent pixels may have planar structures that are symmetrical to each other. FIG. 4 to FIG. 11 are views sequentially showing a manufacturing sequence of a display device according to an exemplary embodiment. FIG. 4, FIG. 6, FIG. 8, and FIG. 10 are top plan views, and FIG. 5, FIG. 7, FIG. 9, and FIG. 11 are cross-sectional views.

As shown in FIG. 1, a display device according to an exemplary embodiment includes a plurality of pixels PX and a plurality of signal lines 127, 151, 152, 154, 155, 171, and 172 capable of displaying an image. One pixel PX may include a plurality of transistors T1, T2, T3, T4, T5, T6, and T7, a capacitor Cst, and at least one light emission diode (LED), which are connected to a plurality of signal lines 127, 151, 152, 154, 155, 171, and 172. In the present exemplary embodiment, an example in which one pixel PX includes one light emission diode (LED) is mainly described.

The signal lines 127, 151, 152, 154, 155, 171, and 172 may include an initialization voltage line 127, a plurality of scan lines 151, 152, and 154, a light emission control line 155, a data line 171, and a driving voltage line 172.

The initialization voltage line 127 may transmit an initialization voltage Vint. A plurality of scan lines 151, 152, and 154 may transmit scan signals GWn, Gin, and GI(n+1), respectively. The scan signals GWn, Gin, and GI(n+1) may transmit a gate-on voltage and a gate-off voltage capable of turning-on/turning-off the transistors T2, T3, T4, and T7 included in the pixel PX.

The scan lines 151, 152, and 154 connected to one pixel PX may include a first scan line 151 capable of transmitting the scan signal GWn, a second scan line 152 capable of transmitting the scan signal GI which has the gate-on voltage at different timing from that of the first scan line 151, and third scan line 154 capable of transmitting the scan signal GI(n+1). In the present embodiment, an example in which the second scan line 152 transmits the gate-on voltage at timing prior to that of the first scan line 151 is mainly described. For example, if the scan signal GWn is an n-th scan signal (Sn) (n is a natural number of 1 or more) among the scan signals applied during one frame, the scan signal GIn may be a scan signal of a previous stage such as the (n−1)-th scan signal S(n−1), and the scan signal GI(n+1) may be the n-th scan signal (Sn). However, the present embodiment is not limited thereto, and the scan signal GI(n+1) may be a different scan signal from the n-th scan signal (Sn).

The light emission control line 155 may transmit a control signal, and particularly may transmit a light emission control signal EM capable of controlling emission of the light emitting diode (LED) included in the pixel PX. The control signal transmitted by the light emission control line 155 may be the gate-on voltage and the gate-off voltage, and may have a different waveform from the scan signal transmitted by the scan lines 151, 152, and 154.

The data line 171 may transmit a data signal Dm, and the driving voltage line 172 may transmit a driving voltage ELVDD. The data signal Dm may have a different voltage level according to the image signal input to the display device, and the driving voltage ELVDD may have a substantially constant level.

Although not shown, the display device may further include a driving circuit that transmits signals to a plurality of signal lines 127, 151, 152, 154, 155, 171, and 172.

A plurality of transistors T1, T2, T3, T4, T5, T6, and T7 included in one pixel PX may include a driving transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal Gin to the fourth transistor T4, the third scan line 154 may transmit the scan signal GI(n+1) to the seventh transistor T7, and the light emission control line 155 may transmit the light emission control signal EM to the fifth transistor T5 and the sixth transistor T6.

The gate electrode G1 of the driving transistor T1 is connected to a driving gate node GN to which one terminal of the capacitor Cst is connected, the first electrode Ea1 of the driving transistor T1 is connected to the driving voltage line 172 via the fifth transistor T5, and the second electrode Eb1 of the driving transistor T1 is connected to an anode of the light emitting diode (LED) via the sixth transistor T6. The driving transistor T1 may receive the data signal Dm transmitted by the data line 171 depending on the switching operation of the second transistor T2 to supply the driving current Id to the light emitting diode (LED).

The gate electrode G2 of the second transistor T2 is connected to the first scan line 151, the first electrode Ea2 of the second transistor T2 is connected to the data line 171, and the second electrode Eb2 of the second transistor T2 is connected to the first electrode Ea1 of the driving transistor T1 and is connected to the driving voltage line 172 via the fifth transistor T5. The second transistor T2 is turned on in response to the scan signal GWn transmitted through the first scan line 151, thereby transmitting the data signal Dm transmitted from the data line 171 to the first electrode Ea1 of the driving transistor T1.

The gate electrode G3 of the third transistor T3 is connected to the first scan line 151, and the first electrode Ea3 of the third transistor T3 is connected to the second electrode Eb1 of the driving transistor T1 and is connected to the anode of the light emitting diode (LED) via the sixth transistor T6. The second electrode Eb3 of the third transistor T3 is connected to the second electrode Eb4 of the fourth transistor T4, one terminal of the capacitor Cst, and the gate electrode G1 of the driving transistor T1. The third transistor T3 is turned on in response to the scan signal GWn transmitted through the first scan line 151 to connect the gate electrode G1 and the second electrode Eb1 of the driving transistor T1, thereby diode-connecting the driving transistor T1.

The gate electrode G4 of the fourth transistor T4 is connected to the second scan line 152, the first electrode Ea4 of the fourth transistor T4 is connected to the initialization voltage Vint terminal, and the second electrode Eb4 of the fourth transistor T4 is connected to one terminal of the capacitor Cst and the gate electrode G1 of the driving transistor T1. The fourth transistor T4 is turned on in response to the scan signal Gin transmitted through the second scan line 152 to transmit the initialization voltage Vint to the gate electrode G1 of the driving transistor T1, thereby performing an initialization step of initializing the voltage of the gate electrode G1 of the driving transistor T1.

The gate electrode G5 of the fifth transistor T5 is connected to the light emission control line 155, the first electrode Ea5 of the fifth transistor T5 is connected to the driving voltage line 172, and the second electrode Eb5 of the fifth transistor T5 is connected to the first electrode Ea1 of the driving transistor T1 and the second electrode Eb2 of the second transistor T2.

The gate electrode G6 of the sixth transistor T6 is connected to the light emission control line 155, the first electrode Ea6 of the sixth transistor T6 is connected to the second electrode Eb1 of the driving transistor T1 and the first electrode Ea3 of the third transistor T3, and the second electrode Eb6 of the sixth transistor T6 is electrically connected to the anode of the light emitting diode (LED). The fifth transistor T5 and the sixth transistor T6 are simultaneously turned on in response to the light emission control signal EM transmitted through the light emission control line 155, thereby transmitting the driving voltage ELVDD to the light emitting diode (LED) through the diode-connected driving transistor T1.

The gate electrode G7 of the seventh transistor T7 is connected to the third scan line 154, the first electrode Ea7 of the seventh transistor T7 is connected to the second electrode Eb6 of the sixth transistor T6 and the anode of the light emitting diode (LED), and the second electrode Eb7 of the seventh transistor T7 is connected to the initialization voltage Vint terminal and the first electrode Ea4 of the fourth transistor T4.

The transistors T1, T2, T3, T4, T5, T6, and T7 may each be a P-type channel transistor such as a PMOS, however they are not limited thereto, and at least one among the transistors T1, T2, T3, T4, T5, T6, and T7 may be an N-type channel transistor and they may include both of the P-type channel transistor and the N-type channel transistor.

As above-described, one terminal of the capacitor Cst is connected to the gate electrode G1 of the driving transistor T1 and the other terminal thereof is connected to the driving voltage line 172. A cathode of the light emitting diode (LED) is connected to the common voltage ELVSS terminal transmitting a common voltage ELVSS, thereby receiving the common voltage ELVSS.

The structure in which one pixel includes seven transistors and one capacitor has been described above, but this is only an example, and the number of the transistors, the number of the capacitors included in one pixel PX of the display device according to an exemplary embodiment, and the connection relationship therebetween may be changed in various ways.

In the above, the third transistor T3 may be a switching transistor for compensating a threshold voltage of the driving transistor T1. Hereinafter, the plane and cross-section shape of the display device according to an exemplary embodiment are described in more detail mainly with the driving transistor T1, the third transistor T3, and the capacitor Cst. The driving transistor T1 may include a first driving transistor T1_1 and a second driving transistor T1_2 coupled in series.

Figure 4:
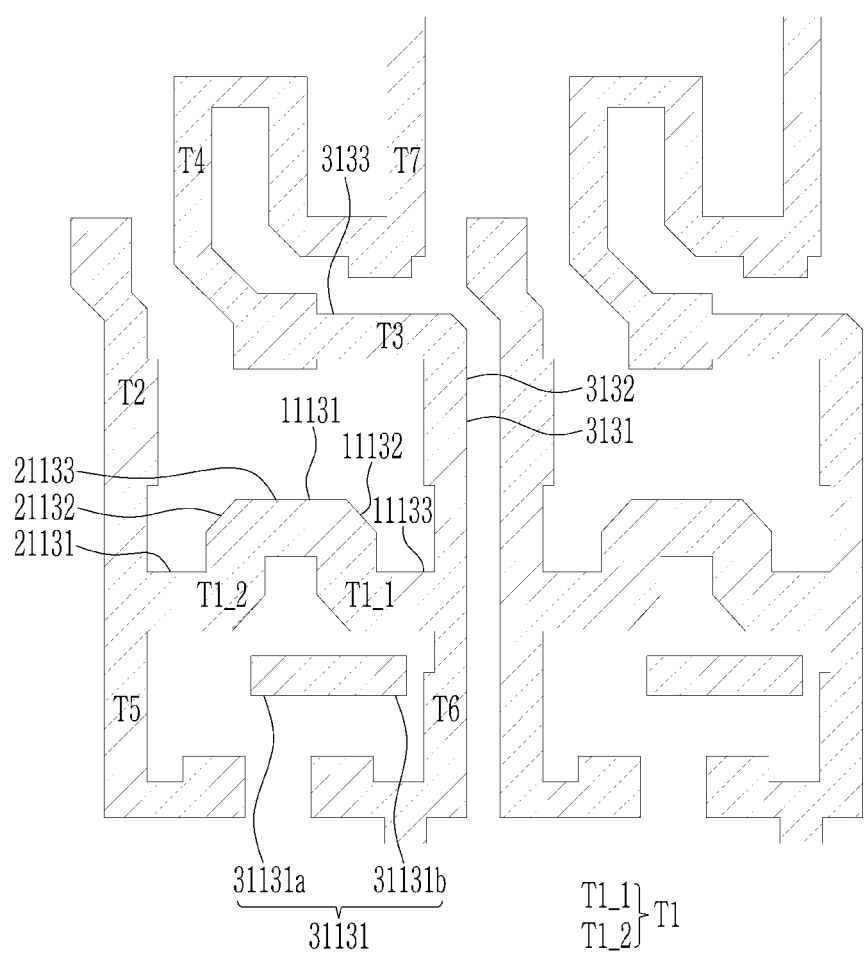
FIG. 4, 5, 6, 7, 8, 9, 10 and FIG. 11 are views sequentially showing a manufacturing sequence of a display device according to an exemplary embodiment.
Figure 5:
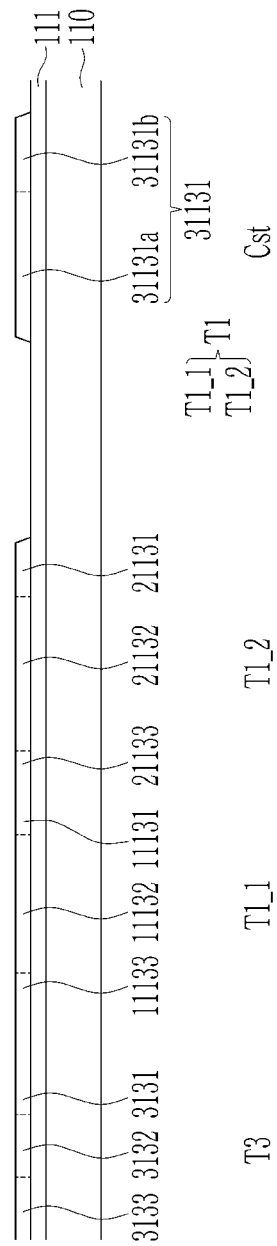

As shown in FIG. 2 to FIG. 11, the display device according to an exemplary embodiment may include a substrate 110 and a semiconductor layer including a channel 11132, a first region 11131, and a second region 11133 of the first driving transistor T1_1, a channel 21132, a first region 21131, and a second region 21133 of the second driving transistor T1_2, and a channel 3132, a first region 3131, and a second region 3133 of the third transistor T3 each of which are disposed on the substrate 110. FIG. 4 and FIG. 5 show the semiconductor layer. The semiconductor layer may further include a channel, a first region, and a second region of each of the second transistor T2, the fourth transistor T4, the fifth transistor T5, the sixth transistor T6, and the seventh transistor T7 as well as the driving transistor T1 and the third transistor T3.

The channel 11132, the first region 11131, and the second region 11133 of the first driving transistor T1_1, the channel 21132, the first region 21131, and the second region 21133 of the second driving transistor T1_2, and the channel 3132, the first region 3131, and the second region 3133 of the third transistor T3 may be connected to each other and be integrally formed. The second region 11133 of the first driving transistor T1_1 may extend from the first region 3131 of the third transistor T3. The first region 11131 of the first driving transistor T1_1 may extend from the second region 21133 of the second driving transistor T1_2.

The channel 11132 of the first driving transistor T1_1 and the channel 21132 of the second driving transistor T1_2 may have a curved shape in a plan view. However, the shapes of the channel 11132 of the first driving transistor T1_1 and the channel 21132 of the second driving transistor T1_2 are not limited thereto, and may be variously changed. For example, the channel 11132 of the first driving transistor T1_1 and the channel 21132 of the second driving transistor T1_2 may be bent into different shapes or may have a bar shape. The first region 11131 and the second region 11133 of the first driving transistor T1_1 may be disposed on both sides of the channel 11132 of the first driving transistor T1_1. The first region 21131 and the second region 21133 of the second driving transistor T1_2 may be disposed on both sides of the channel 21132 of the second driving transistor T1_2.

The first region 21131 of the second driving transistor T1_2 may extend upward and downward in a plan view, and the downwardly extending portion may be connected to the second region of the fifth transistor T5, while the upwardly extending portion may be connected to the second region of the second transistor T2. The second region 11133 of the first driving transistor T1_1 may extend upward and downward in a plan view, and the portion extending downward may be connected to the first region of the sixth transistor T6, while the portion extending upward may be connected to the first region 3131 of the third transistor T3.

The first region 3131 and the second region 3133 of the third transistor T3 may be disposed on respective sides of the channel 3132 of the third transistor T3. One end of the third transistor T3 may be connected to the second region 11133 of the first driving transistor T1_1, and the other end of the third transistor T3 may be connected to the second region of the fourth transistor T4.

The semiconductor layer may further include a capacitor region 31131. The capacitor region 31131 is spaced apart from the channel 11132 of the first driving transistor T1_1 and the channel 21132 of the second driving transistor T1_2 by a predetermined distance. Accordingly, the capacitor region 31131 is not electrically connected to the channel 11132 of the first driving transistor T1_1 and the channel 21132 of the second driving transistor T1_2. The capacitor region 31131 may include a first portion 31131*a* and a second portion 31131*b*. The first portion 31131*a* and the second portion 31131*b* may be integrally connected to each other.

A buffer layer 111 may be disposed between the substrate 110 and the semiconductor layer. The buffer layer 111 may have a single-layer or multi-layered structure. The buffer layer 111 may include an inorganic insulating material such as a silicon nitride (SiNx), a silicon oxide (SiOx), or a silicon oxynitride (SiOxNy), or an organic insulating material. In addition, a barrier layer may be further disposed between the substrate 110 and the buffer layer 111. The barrier layer may have a single-layer or multi-layered structure. The barrier layer may include an inorganic insulating material such as a silicon nitride (SiNx), a silicon oxide (SiOx), or a silicon oxynitride (SiOxNy).

The first gate insulating layer 141 may be disposed on the substrate 110 and the semiconductor layer. That is, the first gate insulating layer 141 may be formed to cover the channel 11132, the first region 11131, and the second region 11133 of the first driving transistor T1_1, the channel 21132, the first region 21131, and the second region 21133 of the second driving transistor T1_2, and the channel 3132, the first region 3131, and the second region 3133 of the third transistor T3. In addition, at least a portion of the first gate insulating layer 141 may be disposed directly on the buffer layer 111. That is, at least a portion of the first gate insulating layer 141 may be in direct contact with the buffer layer 111.

The first gate insulating layer 141 may include a lower first gate insulating layer 141a and an upper first gate insulating layer 141b. The lower first gate insulating layer 141a may be in contact with the semiconductor layer, and the upper first gate insulating layer 141b may be disposed on the lower first gate insulating layer 141b. The upper first gate insulating layer 141b may entirely cover the lower first gate insulating layer 141b.

The first gate insulating layer 141 may include an inorganic insulating material such as a silicon nitride (SiNx), a silicon oxide (SiOx), or a silicon oxynitride (SiOxNy). The lower first gate insulating layer 141a and the upper first gate insulating layer 141b may be made of different materials. For example, the lower first gate insulating layer 141a may be made of a silicon oxide (SiOx) and the upper first gate insulating layer 141b may be made of a silicon nitride (SiNx).

The thickness of the upper first gate insulating layer 141b may be thinner than the thickness of the lower first gate insulating layer 141a. The ratio of the thickness of the upper first gate insulating layer 141b to the thickness of the lower first gate insulating layer 141a may be about 0.2 or more and about 0.8 or less.

In this case, the thickness of the first gate insulating layer 141 may be expressed by an equivalent oxide thickness (EOT). The equivalent oxide thickness may be expressed as in Equation 1 below. That is, it can be expressed by converting the thickness of the first gate insulating layer 141 made of materials with different dielectric constants to the thickness of the layer made of a silicon oxide.

$$T_{EOT} = T_{SiOx} + \left(\frac{\varepsilon_{SiOx}}{\varepsilon_{SiNx}}\right) \times T_{SiNx} \qquad \text{(Equation 1)}$$

($T_{EOT}$: Equivalent oxide thickness, $T_{SiOX}$: Thickness of a layer formed of the silicon oxide, $\varepsilon_{SiOx}$: Dielectric constant of the silicon oxide, $\varepsilon_{SiNx}$: Dielectric constant of the silicon nitride, $T_{SiNx}$: Thickness of a layer formed of the silicon nitride) The equivalent oxide thickness of the first gate insulating layer 141 may be about 800 Å or more and about 1400 Å or less.

Figure 6:
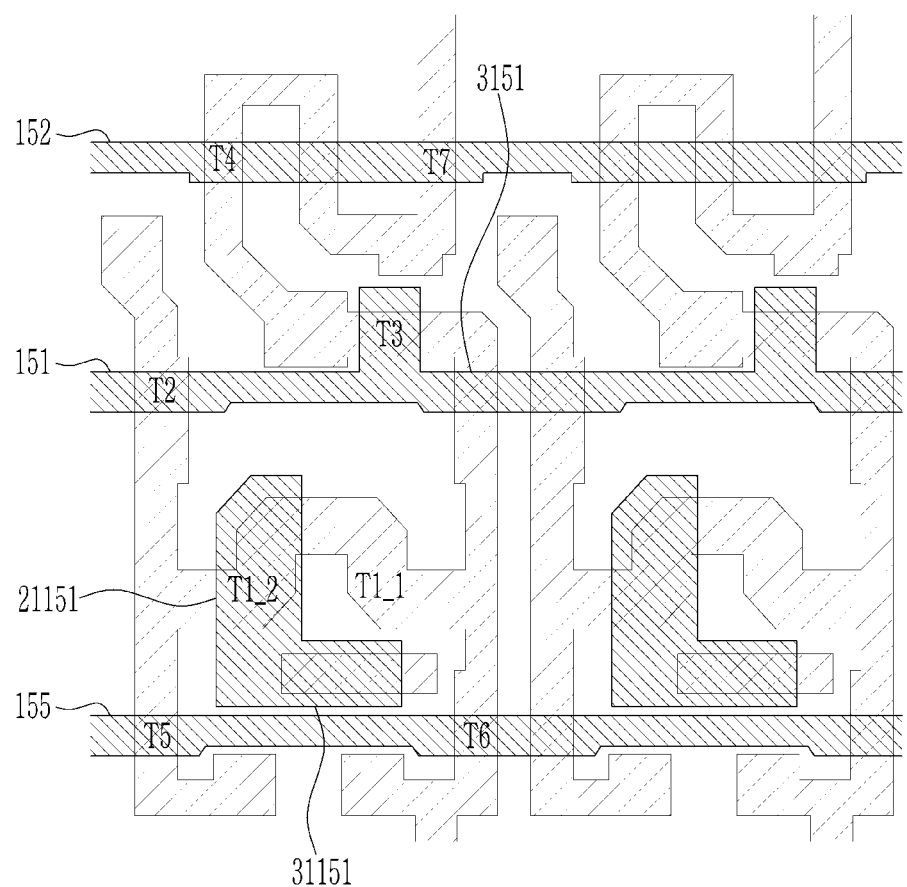
Figure 7:
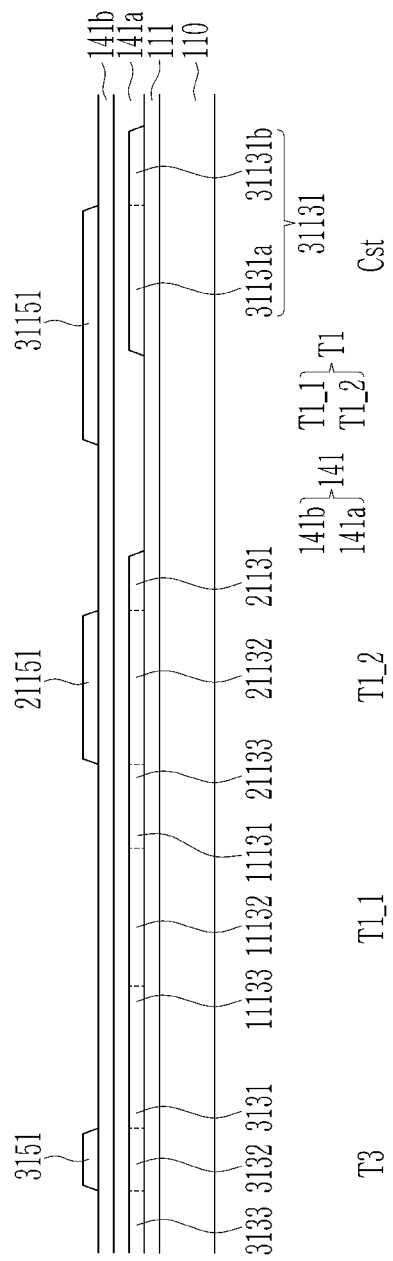

A first gate conductor including the gate electrode 21151 of the second driving transistor T1_2 and the gate electrode 3151 of the third transistor T3 may be disposed on the first gate insulating layer 141. FIG. 6 and FIG. 7 together show the semiconductor layer and the first gate conductor.

The first gate conductor may have a single-layer or multi-layered structure. The first gate conductor may include a metal material such as molybdenum (Mo), aluminum (Al), copper (Cu), and/or titanium (Ti). The first gate conductor may further include a gate electrode of each of the second transistor T2, the fourth transistor T4, the fifth transistor T5, the sixth transistor T6, and the seventh transistor T7 as well as the second driving transistor T1_2 and the third transistor T3.

The gate electrode 21151 of the second driving transistor T1_2 may overlap the channel 21132 of the second driving transistor T1_2. The channel 21132 of the second driving transistor T1_2 is covered by the gate electrode 21151 of the second driving transistor T1_2.

The gate electrode 3151 of the third transistor T3 may overlap the channel 3132 of the third transistor T3. The channel 3132 of the third transistor T3 is covered by the gate electrode 3151 of the third transistor T3.

The first gate conductor may further include a first storage electrode 31151. The first storage electrode 31151 may overlap the capacitor region 31131 to form a first capacitor Cst1. The first storage electrode 31151 may overlap the first portion 31131a of the capacitor region 31131 and may not overlap the second portion 31131b. The first storage electrode 31151 may be connected to the gate electrode 21151 of the second driving transistor T1_2. The first storage electrode 31151 and the gate electrode 21151 of the second driving transistor T1_2 are integrally formed to be directly connected. However, the present inventive concept is not limited thereto, and the first storage electrode 31151 and the gate electrode 21151 of the second driving transistor T1_2 may be connected through a separate bridge electrode.

The first gate conductor may further include a first scan line 151, a second scan line 152, and a light emission control line 155. The first scan line 151, the second scan line 152, and the light emission control line 155 may extend approximately in a row direction. Each of the first scan line 151, the second scan line 152, and the light emission control line 155 may be connected to a plurality of pixels. For example, a plurality of pixels disposed in the same row may be connected to the same first scan line 151, second scan line 152, and light emission control line 155. The first scan line 151 may be connected to the gate electrode of the second transistor T2 and the gate electrode 3151 of the third transistor T3. The first scan line 151 may be integrally formed with the gate electrode of the second transistor T2 and the gate electrode of the third transistor T3. The second scan line 152 may be connected to the gate electrode of the fourth transistor T4. The second scan line 152 may be integrally formed with the gate electrode of the fourth transistor T4. The second scan line 152 may be connected to the gate electrode of the seventh transistor T7 disposed at the pixel of the previous stage. That is, the third scan line 154 connected to the seventh transistor T7 may be formed of the second scan line 152 at the rear end. The light emission control line 155 may be connected to the gate electrode of the fifth transistor T5 and the gate electrode of the sixth transistor T6. The light emission control line 155 may be integrally formed with the gate electrode of the fifth transistor T5 and the gate electrode of the sixth transistor T6.

A second gate insulating layer 142 may be disposed on the first gate conductor and the first gate insulating layer 141. That is, the second gate insulating layer 142 may be formed to cover the gate electrode 21151 of the second driving transistor T1_2 and the gate electrode 3151 of the third transistor T3. In addition, at least a portion of the second gate insulating layer 142 may be disposed directly on the upper first gate insulating layer 141b. That is, at least a portion of the second gate insulating layer 142 may be in direct contact with the upper first gate insulating layer 141b. The second gate insulating layer 142 may be made of the same material as the upper first gate insulating layer 141b. The second gate insulating layer 142 may include an inorganic insulating material such as a silicon nitride (SiNx), a silicon oxide (SiOx), or a silicon oxynitride (SiOxNy). For example, the second gate insulating layer 142 and the upper first gate insulating layer 141*b* may be made of a silicon nitride (SiNx).

The second gate insulating layer 142 and the upper first gate insulating layer 141*b* may be made of the same material, but may be formed through different processes. For example, the second gate insulating layer 142 and the upper first gate insulating layer 141*b* may be formed through different process conditions such as contents of gases such as $SiH_4$, $NH_3$, $N_2$, and a power and a pressure.

The thickness of the second gate insulating layer 142 may be about 1200 Å or more and about 1800 Å or less.

Figure 8:
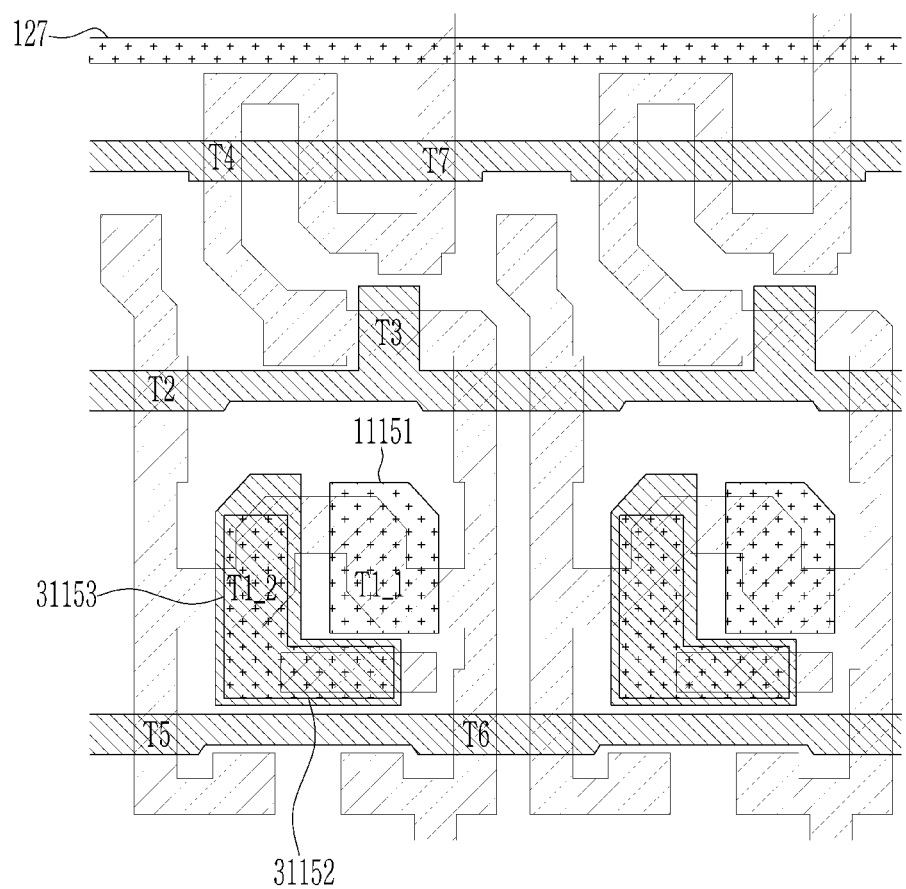
Figure 9:
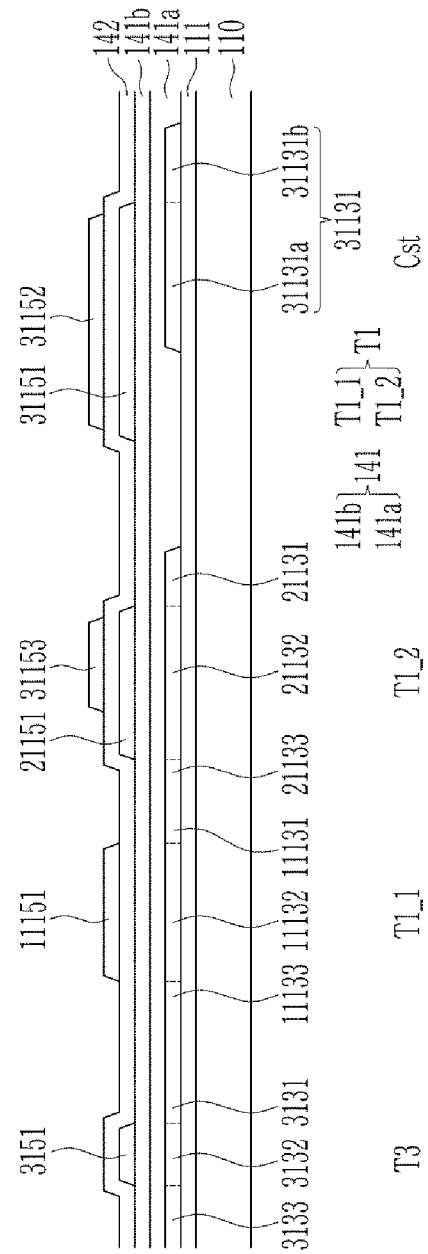

A second gate conductor including the gate electrode 11151 of the first driving transistor T1_1 may be disposed on the second gate insulating layer 142. FIG. 8 and FIG. 9 show the semiconductor layer, the first gate conductor, and the second gate conductor together. The second gate conductor may have a single-layer or multi-layered structure. The second gate conductor may include a metal material such as molybdenum (Mo), aluminum (Al), copper (Cu), and/or titanium (Ti).

The gate electrode 11151 of the first driving transistor T1_1 may overlap the channel 11132 of the first driving transistor T1_1. The channel 11132 of the first driving transistor T1_1 is covered by the gate electrode 11151 of the first driving transistor T1_1.

The first gate insulating layer 141 and the second gate insulating layer may be disposed between the gate electrode 11151 and the channel 11132 of the first driving transistor T1_1. The first gate insulating layer 141 may be disposed between the gate electrode 21151 and the channel 21132 of the second driving transistor T1_2. Accordingly, the thickness of the insulating layer disposed between the gate electrode 11151 and the channel 11132 of the first driving transistor T1_1 may be thicker than the thickness of the insulating layer disposed between the gate electrode 21151 and the channel 21132 of the second driving transistor T1_2. The distance between the gate electrode 21151 and the channel 21132 of the second driving transistor T1_2 may be smaller than the distance between the gate electrode 11151 and the channel 11132 of the first driving transistor T1_1. The driving transistor T1 may include a pair of driving transistors T1_1 and T1_2 having different thicknesses of the insulating layer and connected in series.

The first gate insulating layer 141 may be disposed between the gate electrode 3151 and the channel 3132 of the third transistor T3. Accordingly, the thickness of the insulating layer disposed between the gate electrode 3151 and the channel 3132 of the third transistor T3 may be substantially the same as the thickness of the insulating layer disposed between the gate electrode 21151 and the channel 21132 of the second driving transistor T1_2. The distance between the gate electrode 3151 and the channel 3132 of the third transistor T3 may be substantially the same as the distance between the gate electrode 21151 and the channel 21132 of the second driving transistor T1_2. Also, the thickness of the insulating layer disposed between the gate electrode 3151 and the channel 3132 of the third transistor T3 may be thinner than the thickness of the insulating layer disposed between the gate electrode 11151 and the channel 11132 of the first driving transistor T1_1. The distance between the gate electrode 3151 and the channel 3132 of the third transistor T3 may be smaller than the distance between the gate electrode 11151 and the channel 11132 of the first driving transistor T1_1.

In this way, by differentiating the thickness of the insulating layer of a pair of transistors T1_1 and T1_2 constituting the driving transistor T1 and making the insulating layer of the third transistor T3 relatively thin, the characteristics of the switching transistor and the characteristics of the driving transistor may be respectively optimized. The off current of the third transistor T3 may be reduced and the operating range of the driving transistor T1 may be increased.

The second gate conductor may further include a second storage electrode 31152 and a third storage electrode 31153. The second storage electrode 31152 may overlap the first storage electrode 31151 to form a second capacitor Cst2. The third storage electrode 31153 may overlap the gate electrode 21151 of the second driving transistor T1_2 to form a third capacitor Cst3. That is, the capacitor Cst may include a first capacitor Cst1, a second capacitor Cst2, and a third capacitor Cst3. In this case, the first capacitor Cst1 may have a structure of a metal-insulator-semiconductor (MIS). The second capacitor Cst2 and the third capacitor Cst3 may have a structure of a metal-insulator-metal (MIM).

The second storage electrode 31152 and the third storage electrode 31153 may be connected to each other. The second storage electrode 31152 and the third storage electrode 31153 may be integrally formed and may be directly connected. However, the present inventive concept is not limited thereto, and the second storage electrode 31152 and the third storage electrode 31153 may be connected through a separate bridge electrode.

The second storage electrode 31152 and the third storage electrode 31153 are not connected to the gate electrode 11151 of the first driving transistor T1_1. That is, the second storage electrode 31152 and the third storage electrode 31153 are spaced apart from the gate electrode 11151 of the first driving transistor T1_1.

The second gate conductor may further include an initialization voltage line 127. The initialization voltage line 127 may extend approximately in the row direction. The initialization voltage line 127 may be connected to a plurality of pixels. For example, a plurality of pixels disposed in the same row may be connected to the same initialization voltage line 127.

After forming the second gate conductor, a doping process or plasma treatment may be performed. The part of the semiconductor layer covered by the first gate conductor and the second gate conductor is not doped or plasma treated, and the part of the semiconductor layer not covered by the first gate conductor and the second gate conductor is doped or plasma treated and then may have the same characteristic as the conductor. Therefore, the first and second regions of the first to seventh transistors T1, T2, T3, T4, T5, T6, and T7 of the semiconductor layer may be the first and second electrodes, respectively. In this case, a doping process may be performed with a p-type dopant, and the driving transistor T1, the second transistor T2, the third transistor T3, the fourth transistor T4, the fifth transistor T5, the sixth transistor T6, and the seventh transistor T7 may have a p-type transistor characteristic.

An interlayer insulating layer 160 may be disposed on the second gate conductor and second gate insulating layer 142. The interlayer insulating layer 160 may have a single-layer or multi-layered structure. The interlayer insulating layer 160 may include an inorganic insulating material such as a silicon nitride (SiNx), a silicon oxide (SiOx), and a silicon oxynitride (SiOxNy).

Figure 10:
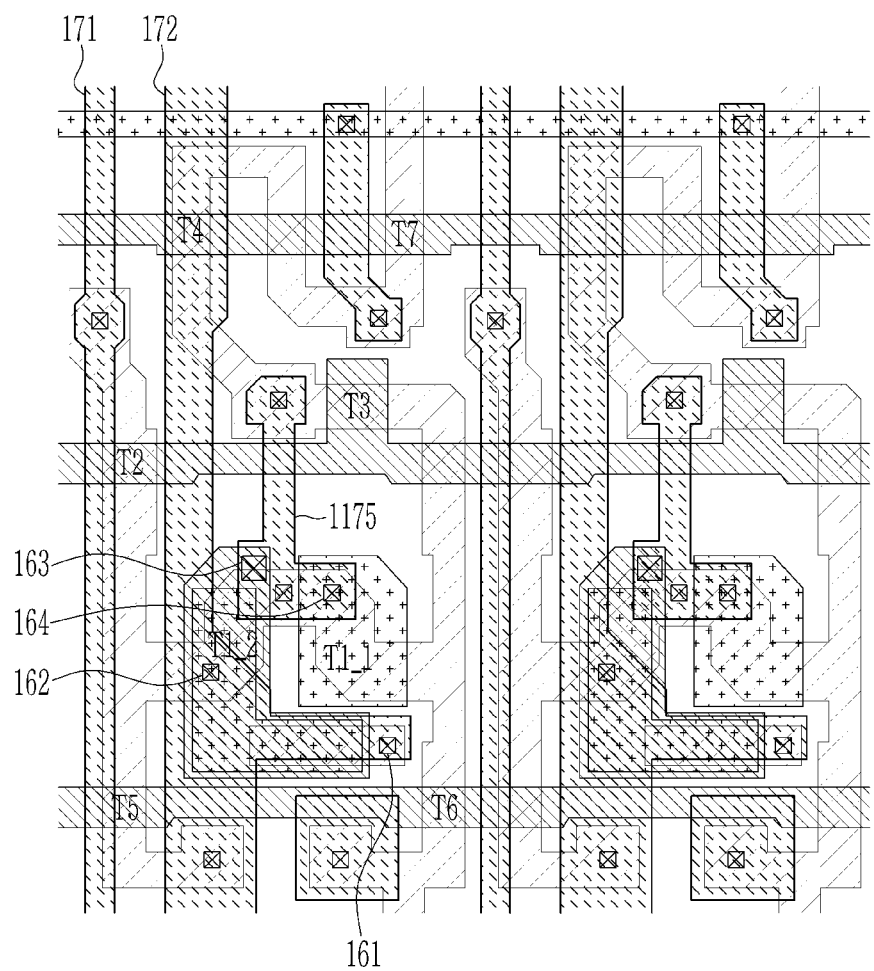
Figure 11:
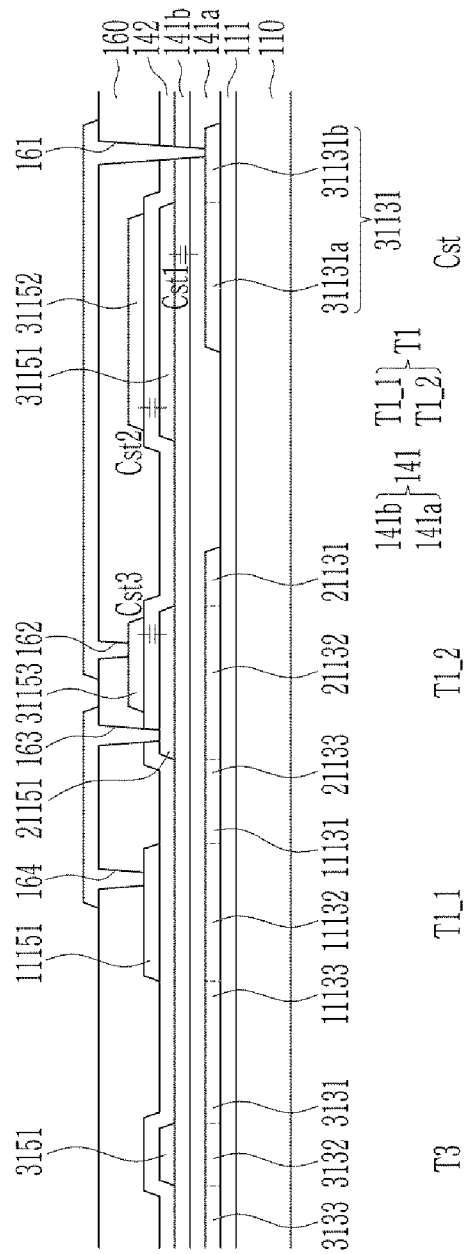

A data conductor including a data line 171, a driving voltage line 172, and a connection electrode 1175 may be disposed on the interlayer insulating layer 160. FIG. 10 and FIG. 11 show the semiconductor layer, the first gate conductor, the second gate conductor and the data conductor together. The data conductor may have a single-layer or multi-layered structure. The data conductor may include a metal material such as molybdenum (Mo), aluminum (Al), copper (Cu), and/or titanium (Ti), and the like.

The data line 171 and the driving voltage line 172 may extend approximately in the column direction. The data line 171 may be connected to the second transistor T2. The driving voltage line 172 may be connected to the fifth transistor T5. Also, the driving voltage line 172 may be connected to the capacitor region 31131. The driving voltage line 172 may overlap the capacitor region 31131. The interlayer insulating layer 160 may include an opening 161 that overlaps the driving voltage line 172 and the second portion 31131b of the capacitor region 31131. The opening 161 may also be formed in the first gate insulating layer 141 and the second gate insulating layer 142. The driving voltage line 172 may be connected to the capacitor region 31131 through the opening 161. Accordingly, the capacitor region 31131 may receive the driving voltage ELVDD through the driving voltage line 172. Also, the driving voltage line 172 may be connected to the third storage electrode 31153. The driving voltage line 172 may overlap the third storage electrode 31153. The interlayer insulating layer 160 may include an opening 162 overlapping the driving voltage line 172 and the third storage electrode 31153. The driving voltage line 172 may be connected to the third storage electrode 31153 through the opening 162. Accordingly, the third storage electrode 31153 may receive the driving voltage ELVDD through the driving voltage line 172.

The connection electrode 1175 may connect the gate electrode 11151 of the first driving transistor T1_1 and the gate electrode 21151 of the second driving transistor T1_2. The portion of the connection electrode 1175 may overlap the gate electrode 11151 of the first driving transistor T1_1. The interlayer insulating layer 160 may include an opening 164 overlapping the connection electrode 1175 and the gate electrode 11151 of the first driving transistor T1_1. The connection electrode 1175 may be connected to the gate electrode 11151 of the first driving transistor T1_1 through the opening 164. Another portion of the connection electrode 1175 may overlap the gate electrode 21151 of the second driving transistor T1_2. The interlayer insulating layer 160 may include an opening 163 overlapping the connection electrode 1175 and the gate electrode 21151 of the second driving transistor T1_2. The opening 163 may also be formed in the second gate insulating layer 142. The connection electrode 1175 may be connected to the gate electrode 21151 of the second driving transistor T1_2 through the opening 163.

Also, the connection electrode 1175 may be connected to the third transistor T3 and the fourth transistor T4. The connection electrode 1175 may be connected to a second region of the third transistor T3 and a second region of the fourth transistor T4. Accordingly, the gate electrode 11151 of the first driving transistor T1_1 and the gate electrode 21151 of the second driving transistor T1_2 may be connected to the second region of the third transistor T3 and the second region of the fourth transistor T4 by the connection electrode 1175.

The data conductor may additionally include other connection electrodes. The first region of the fourth transistor T4 and the second region of the seventh transistor T7 may be connected to the initialization voltage line 127 by the connection electrode. Also, there may be a connection electrode that overlaps the sixth transistor T6 and is connected to the second region of the sixth transistor T6.

A passivation layer 180 may be disposed on the data conductor and interlayer insulating layer 160. The passivation layer 180 may planarize the surface of the substrate 110 including the transistor (TFT), may be an organic insulator, and may include at least one material selected from a group consisting of polyimide, polyamide, acryl resin, benzocyclobutene, and phenol resin.

A pixel electrode 191 may be disposed on the passivation layer 180.

The pixel electrode 191 is also called an anode, and may include a single layer including a transparent conductive oxide film or a metal material, or a multi-layer including these. The transparent conductive oxide layer may include indium tin oxide (ITO), poly-ITO, indium zinc oxide (IZO), indium gallium zinc oxide (IGZO), and indium tin zinc oxide (ITZO). The metal material may include silver (Ag), molybdenum (Mo), copper (Cu), gold (Au), and aluminum (Al). The pixel electrode 191 may be connected to the sixth transistor T6 and may receive an output current of the driving transistor T1.

A bank layer 350 may be disposed on the pixel electrode 191 and the passivation layer 180. The bank layer 350 is also referred to as a pixel defining layer (PDL), and includes a pixel opening 351 overlapping at least a portion of the pixel electrode 191. In this case, the pixel opening 351 may overlap the central portion of the pixel electrode 191 and may not overlap the edge portion of the pixel electrode 191. Accordingly, the size of the pixel opening 351 may be smaller than the size of the pixel electrode 191. The bank layer 350 may partition a formation position of an emission layer 370 so that the emission layer 370 may be disposed on the portion where the upper surface of the pixel electrode 191 is exposed. The bank layer 350 may be an organic insulator including at least one material selected from a group consisting of polyimide, polyamide, acryl resin, benzocyclobutene, and phenol resin. According to an exemplary embodiment, the bank layer 350 may be formed of a black pixel definition layer (BPDL) including a black color pigment.

The emission layer 370 may be disposed within the pixel opening 351 partitioned by the bank layer 350. The emission layer 370 may be disposed over the pixel electrode 191. The emission layer 370 may include an organic material that emits light such as red, green, and blue. The emission layer 370, which emits red, green, and blue light, may include a low molecular or high molecular organic material.

FIG. 3 shows the emission layer 370 as a single layer, but in reality, auxiliary layers such as an electron injection layer, an electron transport layer, a hole transport layer, and a hole injection layer may be further disposed above and below the emission layer 370. In this case, the hole injection layer and the hole transport layer may be disposed under the emission layer 370, and the electron transport layer and the electron injection layer may be disposed on the emission layer 370.

Although not shown, a spacer may be further disposed on the bank layer 350. The spacer may include the same material as the bank layer 350. However, the present inventive concept is not limited thereto, and the spacer may be made of a material that is different from that of the bank layer 350. The spacer may be an organic insulator including at least one material selected from the group consisting of polyimide, polyamide, acryl resin, benzocyclobutene, and phenol resin.

A common electrode 270 may be disposed on the bank layer 350 and the emission layer 370. The common electrode 270 may be formed to be entirely connected over the substrate 110. The common electrode 270 is also referred to as a cathode, and may be formed of a transparent conductive layer including Indium Tin Oxide (ITO), Indium Zinc Oxide (IZO), Indium Gallium Zinc Oxide (IGZO), and Indium Tin Zinc Oxide (ITZO). In addition, the common electrode 270 may have a translucent characteristic, and in this case, may form a micro-cavity together with the pixel electrode 191a. According to the micro-cavity structure, light of a specific wavelength is emitted upwardly due to spacing and a characteristic between both electrodes, and as a result red, green, or blue may be displayed.

The pixel electrode 191, the emission layer 370, and the common electrode 270 may constitute a light-emitting device (ED). Although not shown, an encapsulation layer for protecting the light-emitting device (ED) may be further positioned on the common electrode 270.

Next, the display device according to an exemplary embodiment is described with reference to FIG. 12 to FIG. 24.

The display device according to the exemplary embodiment shown in FIG. 12 to FIG. 24 is the same as most of the display device according to the exemplary embodiment shown in FIG. 1 to FIG. 11 so that the description of the same parts is omitted. The present exemplary embodiment is different from the previous exemplary embodiment in that a third gate conductor is added, and is further described below.

Figure 12:
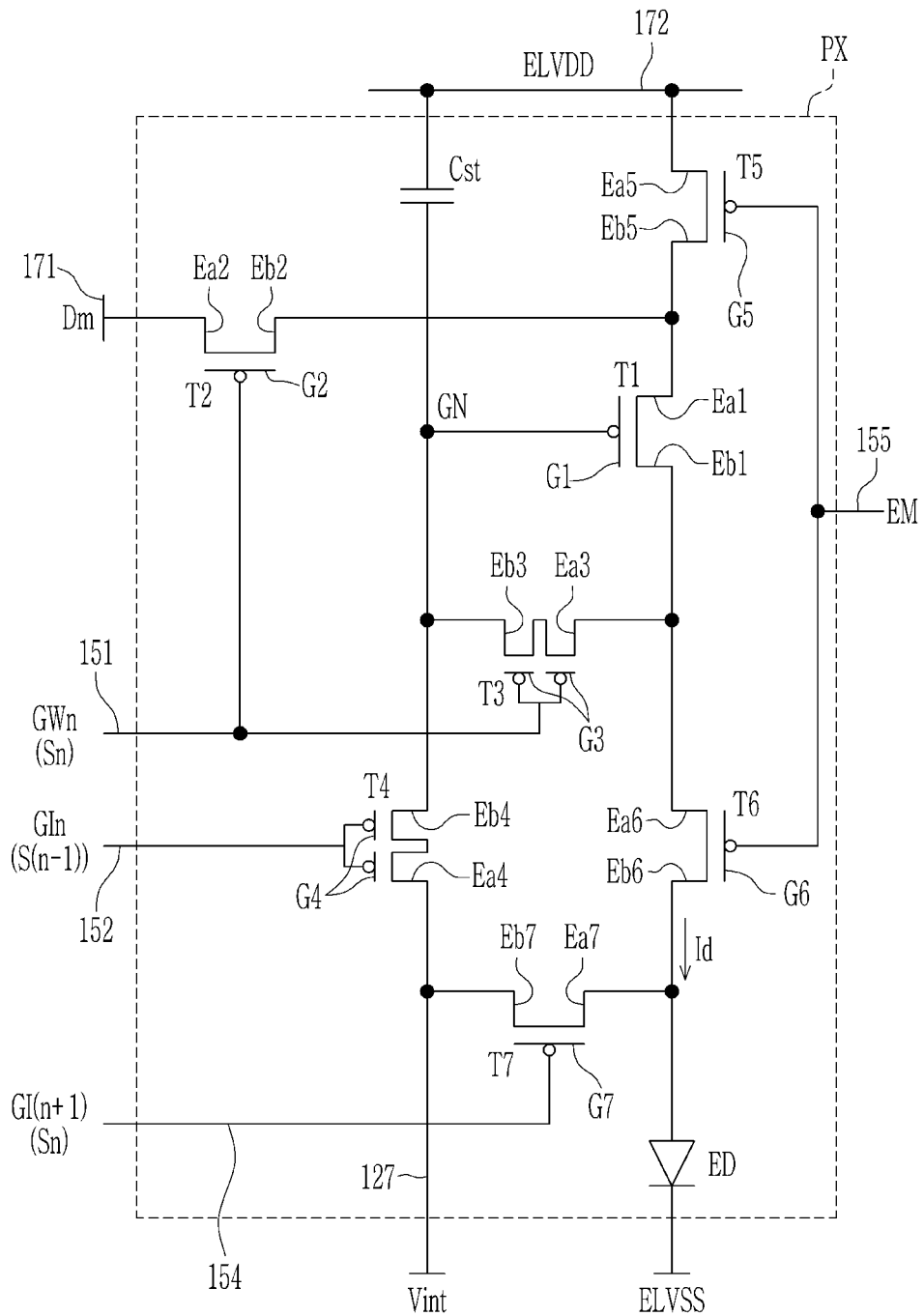
FIG. 12 is a circuit diagram of one pixel of a display device according to an exemplary embodiment.
Figure 13:
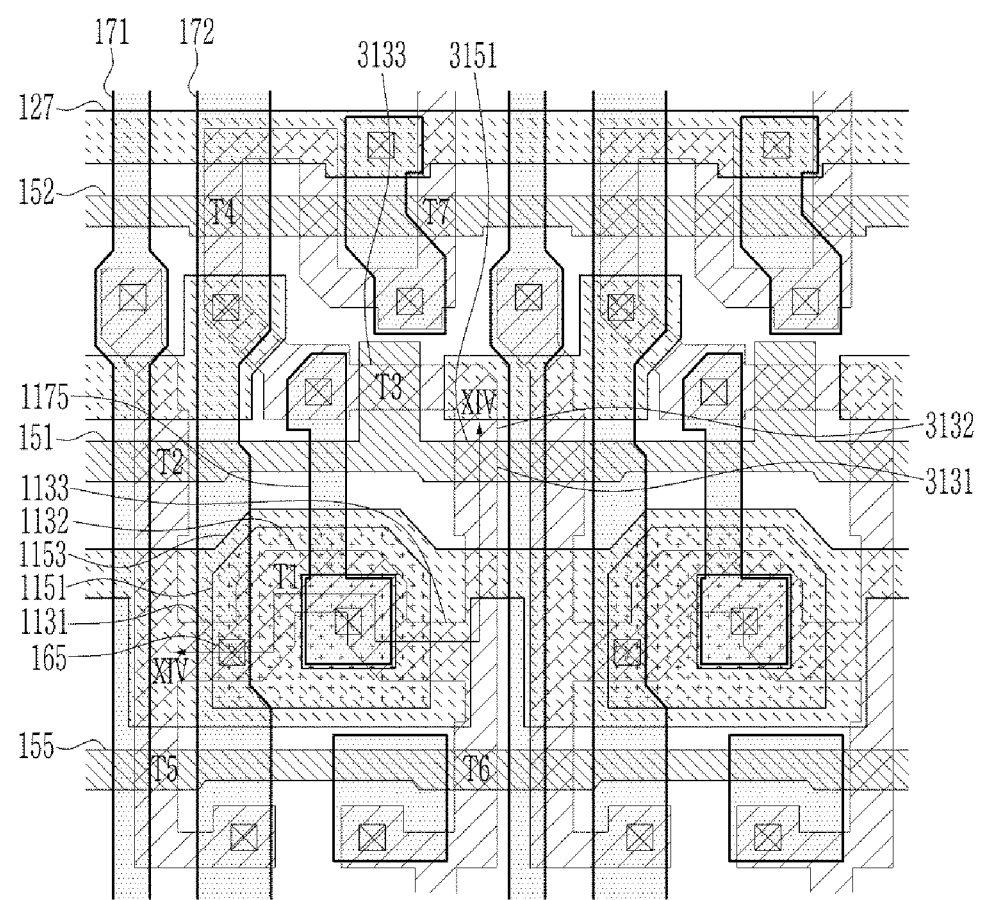
FIG. 13 is a top plan view of a display device according to an exemplary embodiment.
Figure 14:
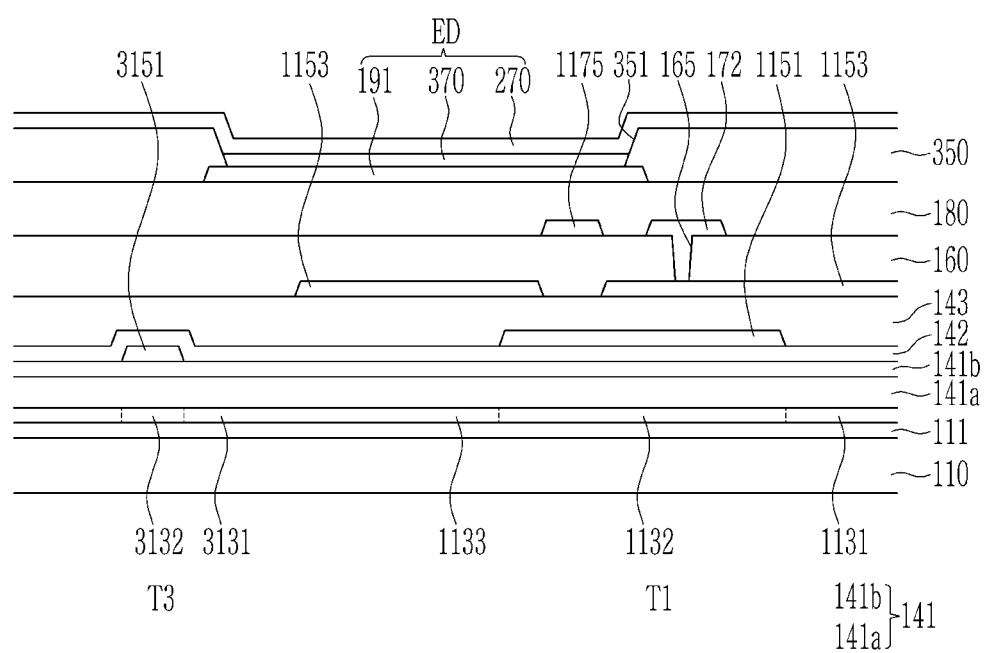
FIG. 14 is a cross-sectional view of a display device according to an exemplary embodiment taken along a line XIV-XIV of FIG. 13.

FIG. 12 is a circuit diagram of one pixel of display device according to an exemplary embodiment, FIG. 13 is a top plan view of a display device according to an exemplary embodiment, and FIG. 14 is a cross-sectional view of a display device according to an exemplary embodiment taken along a line XIV-XIV of FIG. 13. FIG. 13 shows two adjacent pixels, and the two adjacent pixels may have substantially the same structure. However, the present inventive concept is not limited thereto, and the two adjacent pixels may have planar structures that are symmetrical to each other. FIG. 15 to FIG. 24 are views sequentially showing a manufacturing sequence of a display device according to an exemplary embodiment. FIG. 15, FIG. 17, FIG. 19, FIG. 21, and FIG. 23 are top plan views, and FIG. 16, FIG. 18, FIG. 20, FIG. 22, and FIG. 24 are cross-sectional views.

As shown in FIG. 12, the display device according to an exemplary embodiment may include a plurality of pixels PX and a plurality of signal lines 127, 151, 152, 154, 171, and 172 capable of displaying images. One pixel PX may include a plurality of transistors T1, T2, T3, T4, T5, T6, and T7, a capacitor Cst, and at least one light emission diode (LED) which are connected to a plurality of signal lines 127, 151, 152, 154, 171, and 172.

In the above exemplary embodiment, the driving transistor T1 may be formed of a single gate type of transistor. The driving transistor T1 may be formed of a dual gate type of transistor including the first driving transistor and the second driving transistor.

Figure 15:
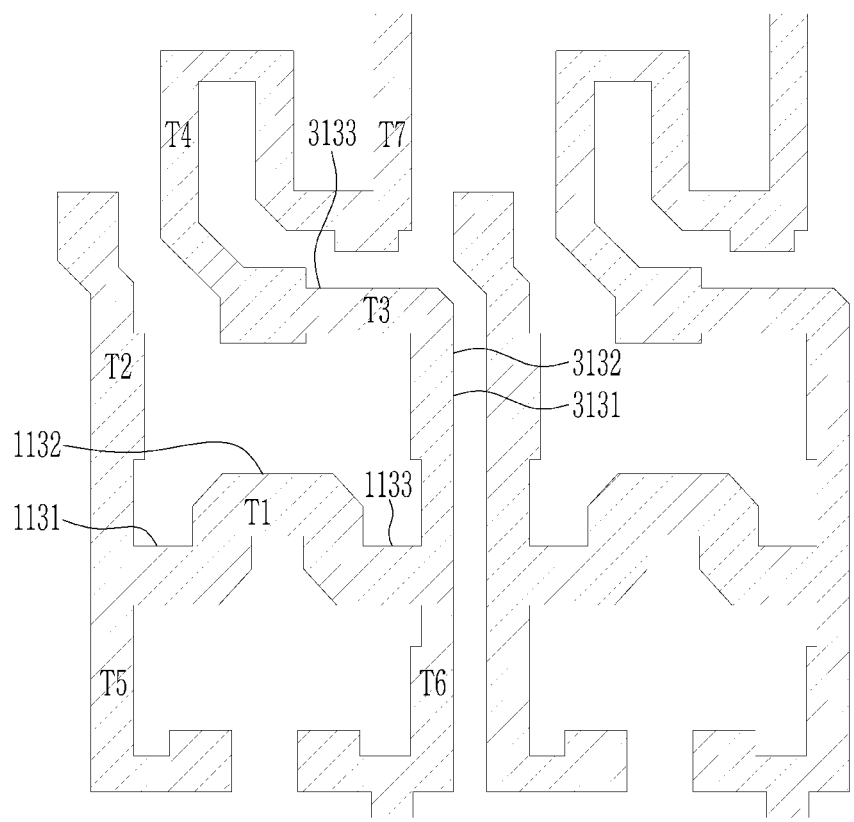
FIG. 15, 16, 17, 18, 19, 20, 21, 22, 23 and FIG. 24 are views sequentially showing a manufacturing sequence of a display device according to an exemplary embodiment.
Figure 16:
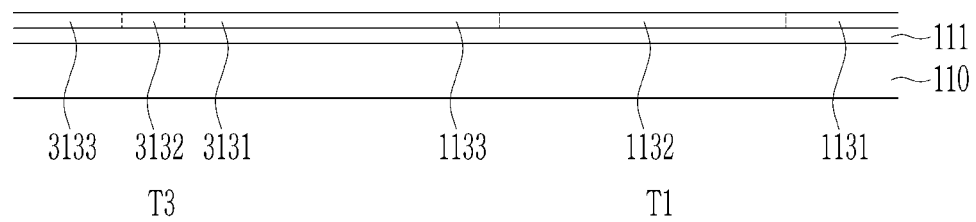

As shown in FIG. 13 to FIG. 24, in the display device according to an exemplary embodiment, the substrate 110, and the semiconductor layer including the channel 1132, the first region 1131, and the second region 1133 of the driving transistor T1 and the channel 3132, the first region 3131, and the second region 3133 of the third transistor T3 disposed on the substrate 110 may be positioned. FIG. 15 and FIG. 16 show the semiconductor layer. The semiconductor layer may further include a channel, a first region, and a second region of each of the second transistor T2, the fourth transistor T4, the fifth transistor T5, the sixth transistor T6, and the seventh transistor T7, as well as the driving transistor T1 and the third transistor T3.

The channel 1132, the first region 1131, and the second region 1133 of the driving transistor T1, and the channel 3132, the first region 3131 and the second region 3133 of the third transistor T3 may be integrally formed by being connected to each other. The second region 1133 of the driving transistor T1 may extend from the first region 3131 of the third transistor T3.

The channel 1132 of the driving transistor T1 may have a curved shape in a plan view. However, the shape of the channel 1132 of the driving transistor T1 is not limited thereto, and may be variously changed. For example, the channel 1132 of the driving transistor T1 may be bent into different shapes or may have a bar shape. The first region 1131 and the second region 1133 of the driving transistor T1 may be positioned on respective sides of the channel 1132 of the driving transistor T1.

The first region 1131 of the driving transistor T1 may extend upward and downward in a plan view, and the downwardly extending portion may be connected to the second region of the fifth transistor T5, while the upwardly extending portion may be connected to the second region of the second transistor T2. The second region 1133 of the driving transistor T1 may extend upward and downward in a plan view, and the portion extending downward may be connected to the first region of the sixth transistor T6, while the portion extending upward may be connected to a first region 3131 of the third transistor T3.

The first region 3131 and the second region 3133 of the third transistor T3 may be positioned on respective sides of the channel 1132 of the third transistor T3. One end of the third transistor T3 may be connected to the second region 1133 of the driving transistor T1, and the other end of the third transistor T3 may be connected to the second region of the fourth transistor T4.

In the foregoing exemplary embodiment, the semiconductor layer may include a capacitor region, and in the present exemplary embodiment, the semiconductor layer may not include a portion constituting the capacitor. That is, the capacitor does not include the semiconductor layer and may be formed of only a metal layer and an insulating layer.

A buffer layer 111 may be disposed between the substrate 110 and the semiconductor layer. A barrier layer may be further disposed between the substrate 110 and the buffer layer 111.

The first gate insulating layer 141 may be disposed on the substrate 110 and the semiconductor layer. The first gate insulating layer 141 may include a lower first gate insulating layer 141a and an upper first gate insulating layer 141b. The upper first gate insulating layer 141b may be disposed on the lower first gate insulating layer 141b. The lower first gate insulating layer 141a and the upper first gate insulating layer 141b may be made of different materials. The lower first gate insulating layer 141a may be made of a silicon oxide (SiOx), and the upper first gate insulating layer 141b may be made of a silicon nitride (SiNx). The ratio of the thickness of the upper first gate insulating layer 141b to the thickness of the lower first gate insulating layer 141a may be about 0.2 or more and about 0.8 or less. The equivalent oxide thickness of the first gate insulating layer 141 may be about 800 Å or more and about 1400 Å or less.

Figure 17:
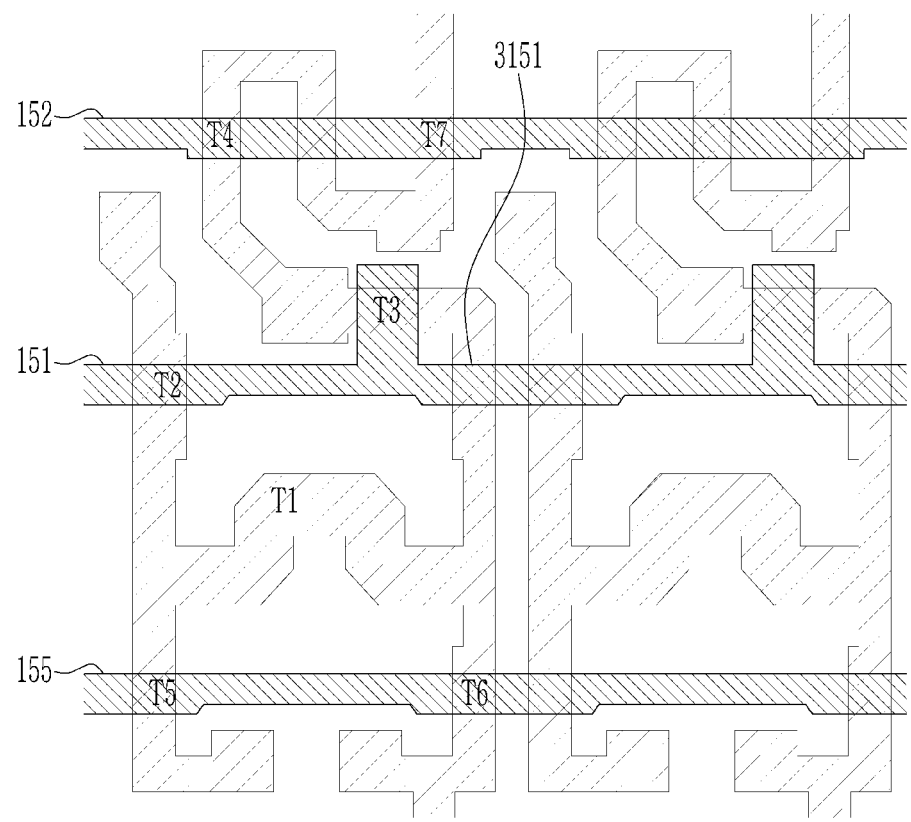
Figure 18:
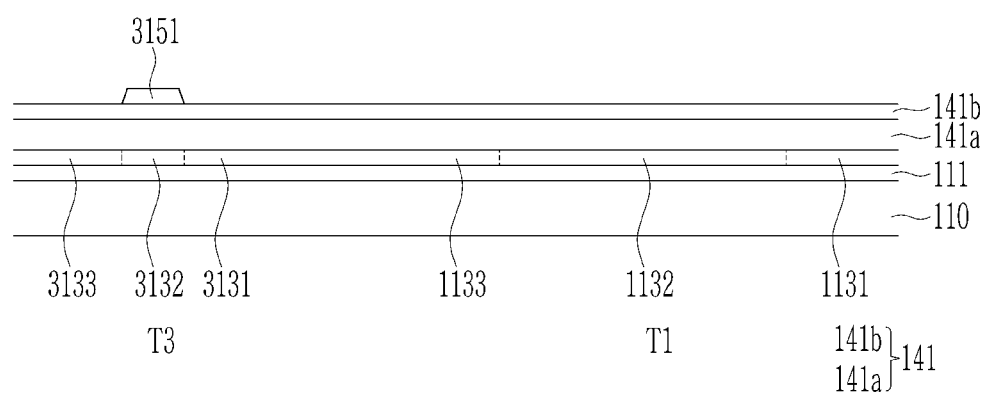

A first gate conductor including the gate electrode 3151 of the third transistor T3 may be disposed on the first gate insulating layer 141. FIG. 17 and FIG. 18 show the semiconductor layer and the first gate conductor together.

In the above exemplary embodiment, the first gate conductor includes the gate electrode of the driving transistor and the electrode constituting the capacitor, and in the present exemplary embodiment, the first gate conductor does not include the gate electrode of the driving transistor T1 and the electrode constituting the capacitor.

The first gate conductor may have a single-layer or multi-layered structure. The first gate conductor may include a metal material such as molybdenum (Mo), aluminum (Al), copper (Cu), and/or titanium (Ti). The first gate conductor may further include the gate electrode of each of the second transistor T2, the fourth transistor T4, the fifth transistor T5, the sixth transistor T6, and the seventh transistor T7 as well as the third transistor T3.

The gate electrode 3151 of the third transistor T3 may overlap the channel 3132 of the third transistor T3. The channel 3132 of the third transistor T3 is covered by the gate electrode 3151 of the third transistor T3.

The first gate conductor may further include a first scan line 151, a second scan line 152, and a light emission control line 155.

A second gate insulating layer 142 may be disposed on the first gate conductor and first gate insulating layer 141. That is, the second gate insulating layer 142 may be formed to cover the gate electrode 3151 of the third transistor T3. At least a portion of the second gate insulating layer 142 may be in contact with the upper first gate insulating layer 141b. The second gate insulating layer 142 may be made of the same material as the upper first gate insulating layer 141b. The second gate insulating layer 142 may include an inorganic insulating material such as a silicon nitride (SiNx), a silicon oxide (SiOx), or a silicon oxynitride (SiOxNy). For example, the second gate insulating layer 142 and the upper first gate insulating layer 141b may be made of a silicon nitride (SiNx). The second gate insulating layer 142 and the upper first gate insulating layer 141b may be formed through different process conditions such as a content, a power, and a pressure of gases such as $SiH_4$, $NH_3$, and $N_2$. The thickness of the second gate insulating layer 142 may be about 1200 Å or more and about 1800 Å or less.

Figure 19:
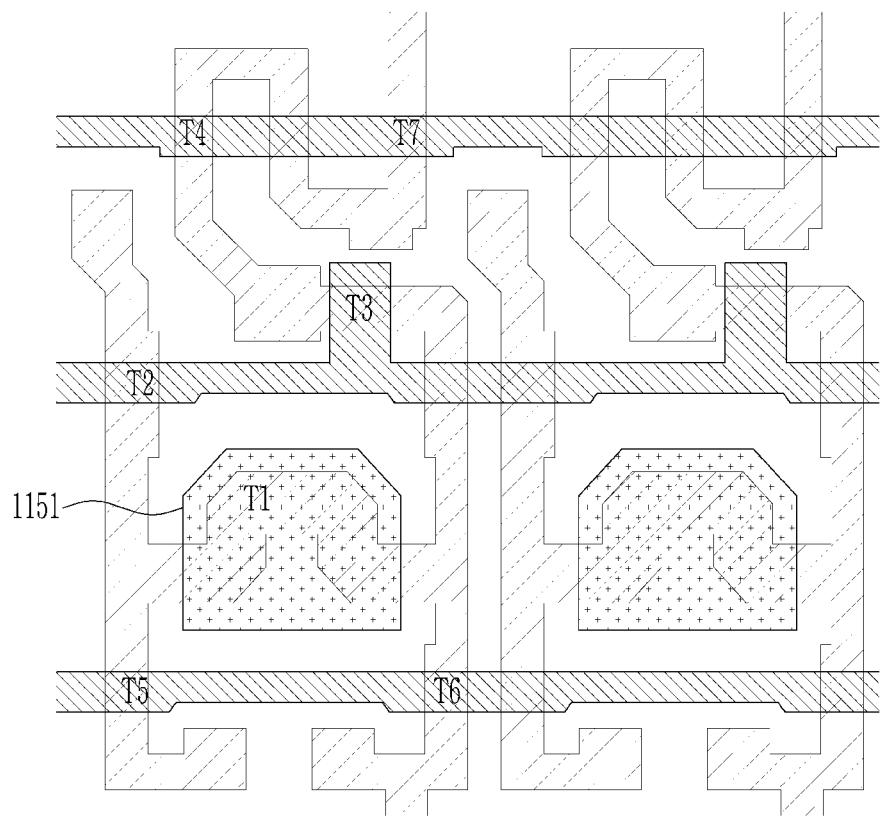
Figure 20:
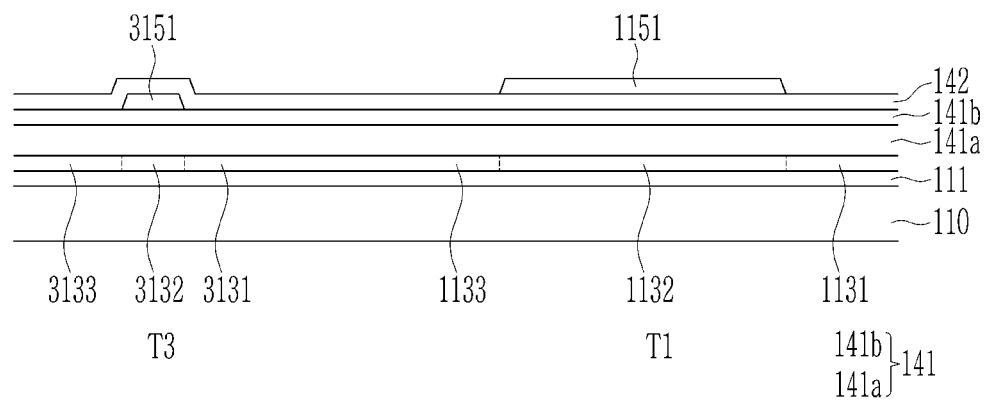

A second gate conductor including the gate electrode 1151 of the driving transistor T1 may be disposed on the second gate insulating layer 142. FIG. 19 and FIG. 20 show the semiconductor layer, the first gate conductor, and the second gate conductor together. The second gate conductor may have a single-layer or multi-layered structure. The second gate conductor may include a metal material such as molybdenum (Mo), aluminum (Al), copper (Cu), and/or titanium (Ti), and the like.

The gate electrode 1151 of the driving transistor T1 may overlap the channel 1132 of the driving transistor T1. The channel 1132 of the driving transistor T1 is covered by the gate electrode 1151 of the driving transistor T1.

The first gate insulating layer 141 and the second gate insulating layer may be disposed between the gate electrode 1151 and the channel 1132 of the driving transistor T1. The first gate insulating layer 141 may be disposed between the gate electrode 3151 and the channel 3132 of the third transistor T3. Accordingly, the thickness of the insulating layer disposed between the gate electrode 3151 and the channel 3132 of the third transistor T3 may be thinner than the thickness of the insulating layer disposed between the gate electrode 1151 and the channel 1132 of the driving transistor T1. The distance between the gate electrode 3151 and the channel 3132 of the third transistor T3 may be smaller than the distance between the gate electrode 1151 and the channel 1132 of the driving transistor T1.

As such, by forming the thickness of the insulating layer of the third transistor T3 to be relatively thinner than the thickness of the insulating layer of the driving transistor T1, the characteristics of the switching transistor and the characteristics of the driving transistor can be optimized, respectively. The off current of the third transistor T3 may be reduced and the operating range of the driving transistor T1 may be increased.

After forming the second gate conductor, a doping process or plasma treatment may be performed. The part of the semiconductor layer covered by the first gate conductor and second gate conductor is not doped or plasma-treated, and the part of the semiconductor layer not covered by the first gate conductor and the second gate conductor is doped or plasma-treated and then may have the same characteristic as the conductor. Therefore, the first and second regions of the first to seventh transistors T1, T2, T3, T4, T5, T6, and T7 of the semiconductor layer may be the first and second electrodes, respectively. In this case, the doping process may be performed with a p-type dopant, and the driving transistor T1, the second transistor T2, the third transistor T3, the fourth transistor T4, the fifth transistor T5, the sixth transistor T6, and the seventh transistor T7 may have p-type transistor characteristics.

A third gate insulating layer 143 may be disposed on the second gate conductor and the second gate insulating layer 142. That is, the third gate insulating layer 143 may be formed to cover the gate electrode 1151 of the driving transistor T1. In addition, at least part of the third gate insulating layer 143 may be disposed directly on the second gate insulating layer 142. That is, at least a portion of the third gate insulating layer 143 may be in direct contact with the second gate insulating layer 142. The third gate insulating layer 143 may include an inorganic insulating material such as a silicon nitride (SiNx), a silicon oxide (SiOx), or a silicon oxynitride (SiOxNy).

Figure 21:
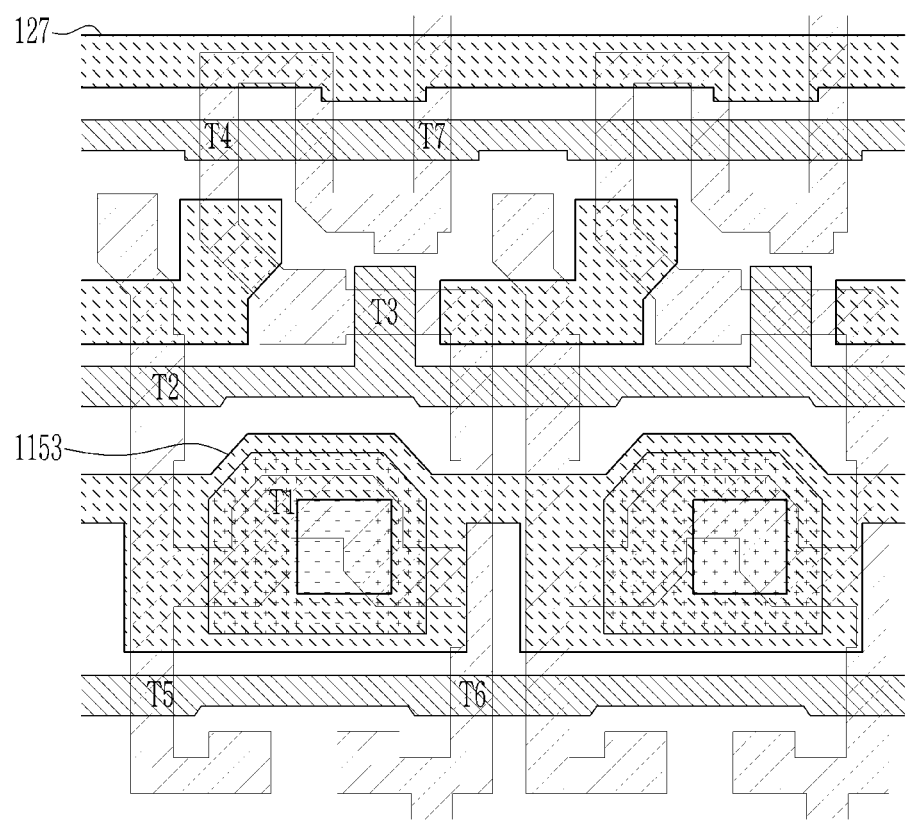
Figure 22:
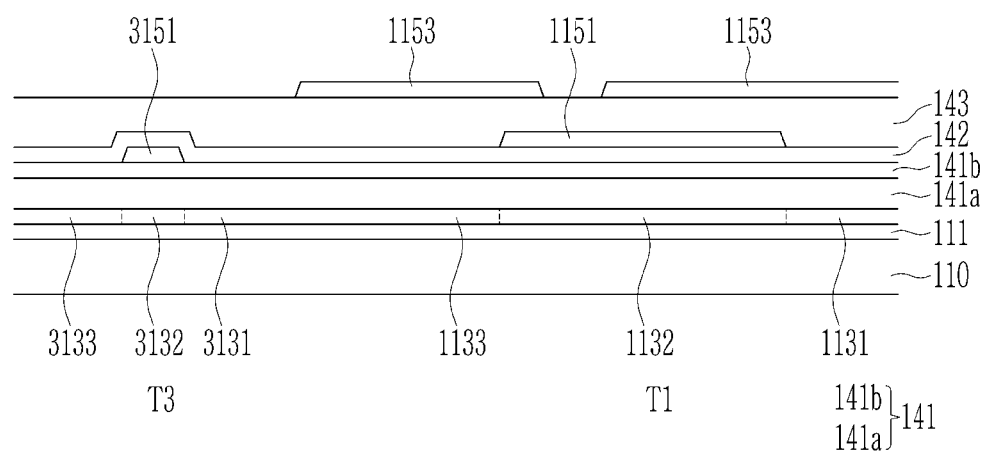

A third gate conductor including the storage electrode 1153 may be disposed on the third gate insulating layer 143. FIG. 21 and FIG. 22 show the semiconductor layer, the first gate conductor, the second gate conductor, and the third gate conductor. The third gate conductor may have a single-layer or multi-layered structure. The third gate conductor may include a metal material such as molybdenum (Mo), aluminum (Al), copper (Cu), and/or titanium (Ti).

The storage electrode 1153 may overlap the gate electrode 1151 of the driving transistor T1 to form the capacitor Cst. In this case, the capacitor Cst may have a structure of a metal layer—an insulating layer—a metal layer (MIM). In the present exemplary embodiment, by adding a separate third gate conductor to form the storage electrode 1153, the capacity of the capacitor may be secured while reducing the area of one pixel.

The third gate conductor may further include an initialization voltage line 127. The initialization voltage line 127 may extend approximately in the row direction. The initialization voltage line 127 may be connected to a plurality of pixels. For example, a plurality of pixels positioned in the same row may be connected to the same initialization voltage line 127.

An interlayer insulating layer 160 may be disposed on the third gate conductor and the third gate insulating layer 143. The interlayer insulating layer 160 may have a single-layer or multi-layered structure. The interlayer insulating layer 160 may include an inorganic insulating material such as a silicon nitride (SiNx), a silicon oxide (SiOx), or a silicon oxynitride (SiOxNy).

Figure 23:
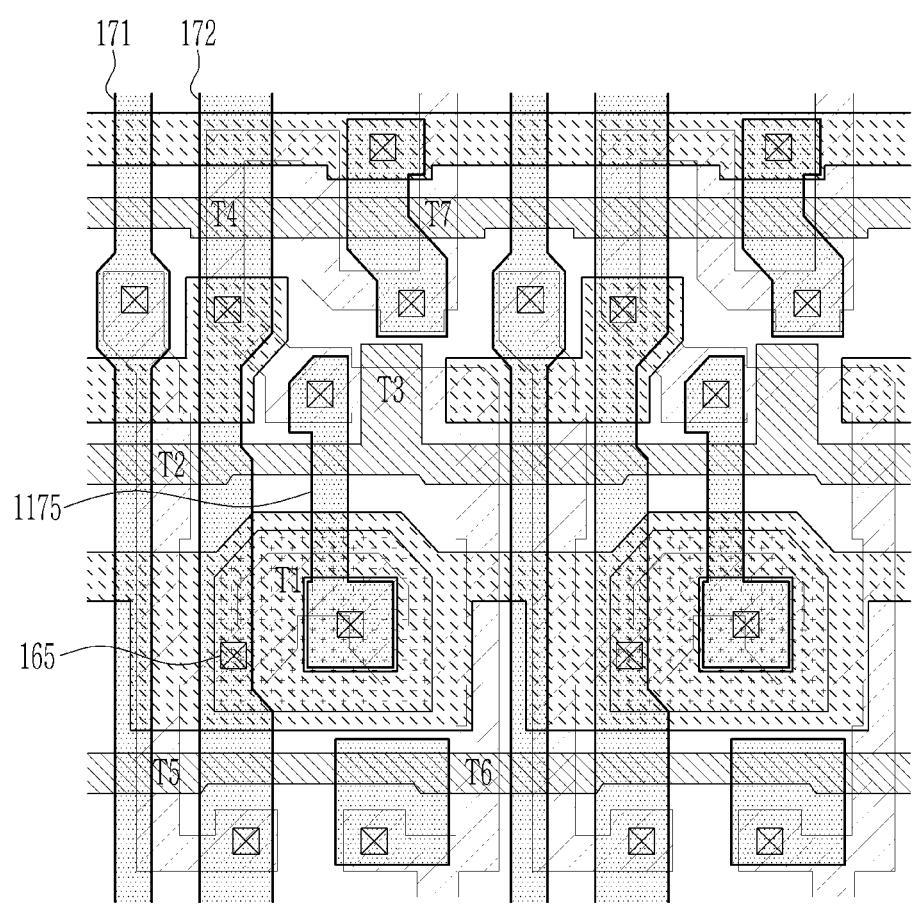
Figure 24:
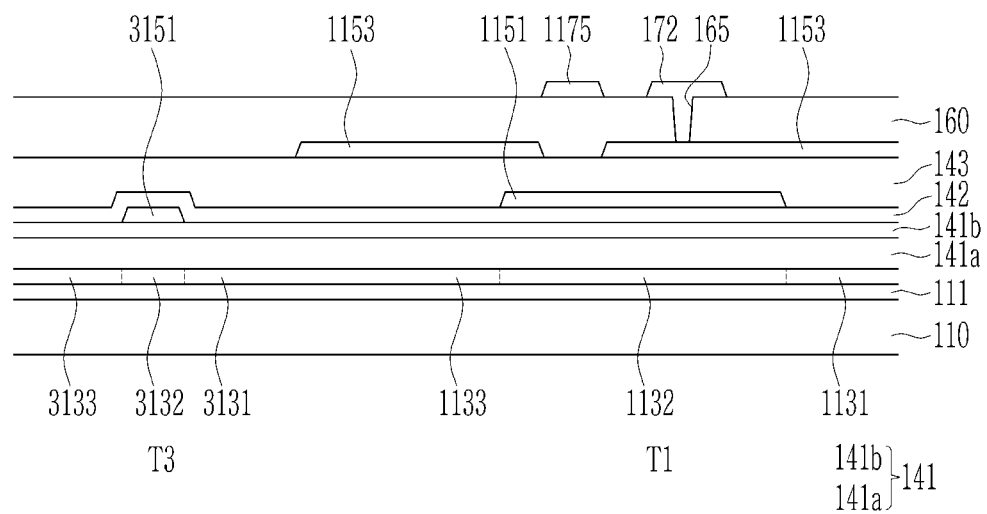

A data conductor including a data line 171, a driving voltage line 172, and a connection electrode 1175 may be disposed on the interlayer insulating layer 160. FIG. 23 and FIG. 24 show the semiconductor layer, the first gate conductor, the second gate conductor, the third gate conductor, and the data conductor together. The data conductor may have a single-layer or multi-layered structure. The data conductor may include a metal material such as molybdenum (Mo), aluminum (Al), copper (Cu), and/or titanium (Ti).

The data line 171 and the driving voltage line 172 may extend approximately in the column direction. The data line 171 may be connected to the second transistor T2. The driving voltage line 172 may be connected to the fifth transistor T5. Also, the driving voltage line 172 may be connected to the storage electrode 1153. The driving voltage line 172 may overlap the storage electrode 1153. The interlayer insulating layer 160 may include an opening 165 overlapping the driving voltage line 172 and the storage electrode 1153. The driving voltage line 172 may be connected to the storage electrode 1153 through the opening 165. Accordingly, the storage electrode 1153 may receive the driving voltage ELVDD through the driving voltage line 172.

The connection electrode 1175 may connect the gate electrode 1151 of the driving transistor T1 to the second region of the third transistor T3 and the second region of the fourth transistor T4. The data conductor may additionally include other connection electrodes.

A passivation layer may be disposed on the data conductor and the interlayer insulating layer 160. A light-emitting device (ED) including a pixel electrode, an emission layer, and a common electrode may be disposed on the passivation layer.

The display device according to an exemplary embodiment is characterized in that the thickness of the insulating layer of the driving transistor of each pixel and the thickness of the insulating layer of the switching transistor are differentially formed. The display device according to an exemplary embodiment may further include a driving circuit for supplying a predetermined signal to each pixel, and the driving circuit may include a plurality of transistors. In this case, the thickness of the insulating layer of the plurality of transistors constituting the driving circuit may be designed differently, and an application example is described with reference to FIG. 25 and FIG. 26.

First, a part of the driving circuit of the display device according to an exemplary embodiment is described with reference to FIG. 25.

Figure 25:
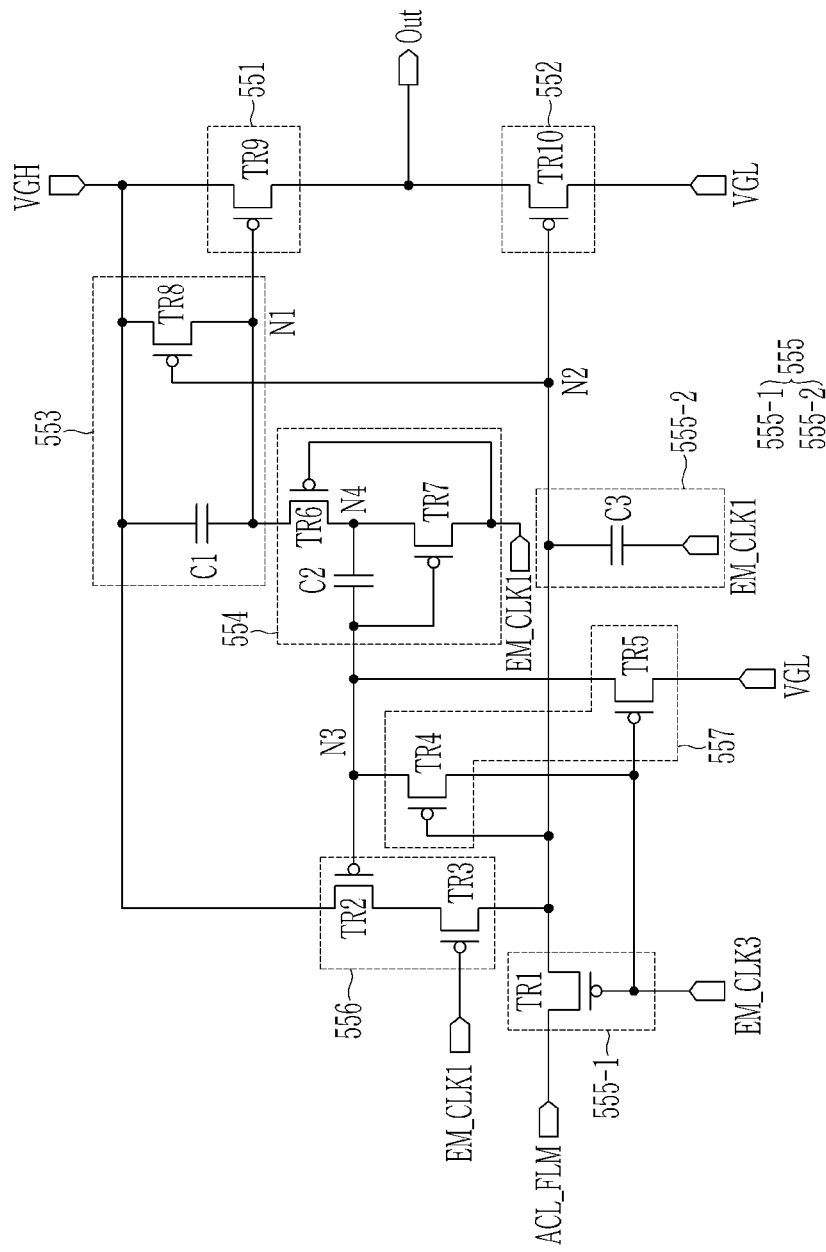
FIG. 25 is a circuit diagram showing one stage of a light emission signal generating unit of a display device according to an exemplary embodiment.

FIG. 25 is a circuit diagram showing one stage of a light emission signal generating unit of a display device according to an exemplary embodiment.

As shown in FIG. 25, a stage for a light emission signal included in a light emission signal generating circuit of the display device according to an exemplary embodiment includes a pull-up circuit 551, a pull-down circuit 552, a first node first controller 553, a first node second controller 554, a second node first controller 555, a second node second controller 556, and a third node controller 557.

The pull-up circuit 551 is a part that outputs a high voltage VGH of the light emission signal, and the pull-down circuit 552 is a part that outputs a low voltage VGL of the light emission signal. The pull-up circuit 551 and the pull-down circuit 552 are connected to an output terminal Out, and when the high voltage VGH is output from the pull-up circuit 551, the pull-down circuit 552 is not output, and when the low voltage VGL is output from the pull-down circuit 552, the pull-up circuit 551 is not output.

The pull-up circuit 551 is controlled according to the voltage of the first node N1, and the voltage of the first node N1 is controlled by the first node first controller 553 and the first node second controller 554.

The pull-down circuit 552 is controlled according to the voltage of the second node N2, and the voltage of the second node N2 is controlled by the second node first controller 555 and the second node second controller 556. In FIG. 25, the second node first controller 555 may include a first/second node first controller 555-1 and a second/second node first controller 555-2.

The first node second controller 554 is controlled by the voltage of the third node N3, and the voltage of the third node N3 is controlled by the third node controller 557.

The pull-up circuit 551 includes a ninth transistor TR9, the control electrode of the ninth transistor TR9 is connected to the first node N1, the input electrode is connected to the high voltage VGH terminal, and the output electrode is connected to the output terminal Out. As a result, when the voltage of the first node N1 is a low voltage, the high voltage VGH is output to the output terminal Out, and when the voltage of the first node N1 is a high voltage, the ninth transistor TR9 does not output.

The pull-down circuit 552 includes a tenth transistor TR10, the control electrode of the tenth transistor TR10 is connected to the second node N2, the input electrode is connected to the low voltage VGL terminal, and the output electrode is connected to the output terminal Out. As a result, when the voltage of the second node N2 is the low voltage, the low voltage VGL is output to the output terminal Out, and when the voltage of the second node N2 is the high voltage, the tenth transistor TR10 does not output.

The voltage of the first node N1 is controlled by the first node first controller 553 and the first node second controller 554.

The first node first controller 553 includes one transistor (an eighth transistor TR8) and one capacitor (a first capacitor C1). The control electrode of the eighth transistor TR8 is connected to the second node N2, the input electrode is connected to the high voltage VGH, and the output electrode is connected to the first node N1. Meanwhile, two electrodes of the first capacitor C1 are respectively connected to the input electrode and the output electrode of the eighth transistor, and the first capacitor C1 is connected between the first node N1 and the high voltage VGH terminal. The eighth transistor TR8 transfers the high voltage VGH to the first node N1 when the second node N2 has a low voltage, and the first capacitor C1 stores and maintains the voltage of the first node N1. That is, the first node first controller 553 serves to change the voltage of the first node N1 to a high voltage VGH.

Meanwhile, the first node second controller 554 includes two transistors (a sixth transistor TR6 and a seventh transistor TR7) and one capacitor (a second capacitor C2). The control electrode of the sixth transistor TR6 is connected to the first clock input terminal In1, the output electrode is connected to the first node N1, and the input electrode is connected to the fourth node N4. The control electrode of the seventh transistor TR7 is connected to the third node N3, the output electrode is connected to the fourth node N4, and the input electrode is connected to the first clock input terminal In1. Here, the input and output of the input and output electrodes may be exchanged oppositely depending on the magnitude of the voltage to be connected. The first node second controller 554 serves to change the voltage of the first node N1 to the low voltage of the clock signal.

Meanwhile, the second capacitor C2 is connected between the third node N3 and the fourth node N4, and may boost up the voltage of the fourth node N4 by using the voltage difference between two nodes.

The voltage of the second node N2 is controlled by the second node first controller 555 and the second node second controller 556.

The second node first controller 555 consists of a first/second node first controller 555-1 and a second/second node first controller 555-2, and the first/second node first controller 555-1 consists of one transistor (a first transistor TR1), while the second/second node first controller 555-2 consists of one capacitor (a third capacitor C3). The control electrode of the first transistor TR1 is connected to the second clock input terminal IN2, the input electrode is connected to the control terminal ACL_FLM, and the output electrode is connected to the second node N2. The third capacitor C3 has one electrode connected to the second node N2 and the other electrode connected to the first clock input terminal IN1.

Due to the structure of the third capacitor C3, the voltage of the second node N2 may be changed due to a fluctuating clock signal applied to the first clock input terminal IN1. Therefore, in order to reduce the fluctuation of the second node N2, the capacitance of the third capacitor C3 may be set to a very large value. As a result, even if the clock signal applied to one side of the third capacitor C3 is changed, the voltage of the other side, that is, the voltage of the second node N2, may not be significantly changed. Due to this third capacitor C3, the capacitance of the first clock input terminal IN1 has a very large value compared to the capacitance of the second clock input terminal IN2.

The first transistor TR1 belonging to the second node first controller 555 changes the voltage of the second node N2 to the voltage of the control signal FLM or the light emission signal of the previous stage when the third clock signal EM_CLK3 applied to the second clock input terminal IN2 has a low voltage, and the third capacitor C3 stores and maintains it. That is, the second node first controller 555 serves to change the voltage of the second node N2 to a high voltage or a low voltage according to the carry signal (the control signal FLM) or the light emission signal of the previous stage.

The second node second controller 556 includes two transistors (a second transistor TR2 and a third transistor TR3). The control electrode of the second transistor TR2 is connected to the third node N3, the input electrode is connected to the high voltage VGH terminal, and the output electrode is connected to the input electrode of the third transistor TR3. The control electrode of the third transistor TR3 is connected to the first clock input terminal IN1, the input electrode is connected to the output electrode of the second transistor TR2, and the output electrode is connected to the second node N2. That is, the second node second controller 556 prevents the second node N2 voltage from being changed to the low voltage since the high voltage VGH is connected to the second node N2.

The third node controller 557 consists of two transistors (a fourth transistor TR4 and a fifth transistor TR5). The control terminal of the fourth transistor TR4 is connected to the second node N2, the input terminal is connected to the second clock input terminal IN2, and the output terminal is connected to the third node N3. The control terminal of the fifth transistor TR5 is connected to the second clock input terminal IN2, the input terminal is connected to the low voltage VGL terminal, and the output terminal is connected to the third node N3. The fifth transistor TR5 plays a role in making the voltage of the third node N3 the low voltage VGL, and the fourth transistor TR4 makes the voltage of the third node N3 the voltage of the second clock input terminal IN2 so that the voltage of the third node N3 is changed to the high voltage (the high voltage of the clock signal).

The ninth transistor TR9 and the tenth transistor TR10 are buffer transistors requiring an increase in the on-current, and may include a relatively thin insulating layer. For example, the ninth transistor TR9 and the tenth transistor TR10 may have a structure similar to that of the third transistor of each pixel described above. That is, the first gate insulating layer may be positioned between the gate electrode and the channel of the ninth transistor TR9 and between the gate electrode and the channel of the tenth transistor TR10.

The first transistor TR1, the second transistor TR2, and the fourth transistor TR4 are transistors that require a reliability improvement and may include a relatively thick insulating layer. For example, the first transistor TR1, the second transistor TR2, and the fourth transistor TR4 may have a structure similar to the driving transistor of each pixel described above. That is, the first gate insulating layer and the second gate insulating layer may be positioned between the gate electrode and the channel of the first transistor TR1, between the gate electrode and the channel of the second transistor TR2, and between the gate electrode and the channel of the fourth transistor TR4.

In addition, the third capacitor C3 may have a structure in which the insulating layer is positioned between the electrode made of the first gate conductor and the electrode made of the second gate conductor. That is, the third capacitor C3 may have a structure of a metal layer-insulating layer-metal layer (MIM). The second capacitor C2 may have a structure in which the insulating layer is positioned between the electrode made of the second gate conductor and the region made of the semiconductor layer. That is, the second capacitor C2 may have a structure of a metal layer-insulating layer-semiconductor layer (MIS).

Next, another part of the driving circuit of the display device according to an exemplary embodiment is described with reference to FIG. 26 as follows.

Figure 26:
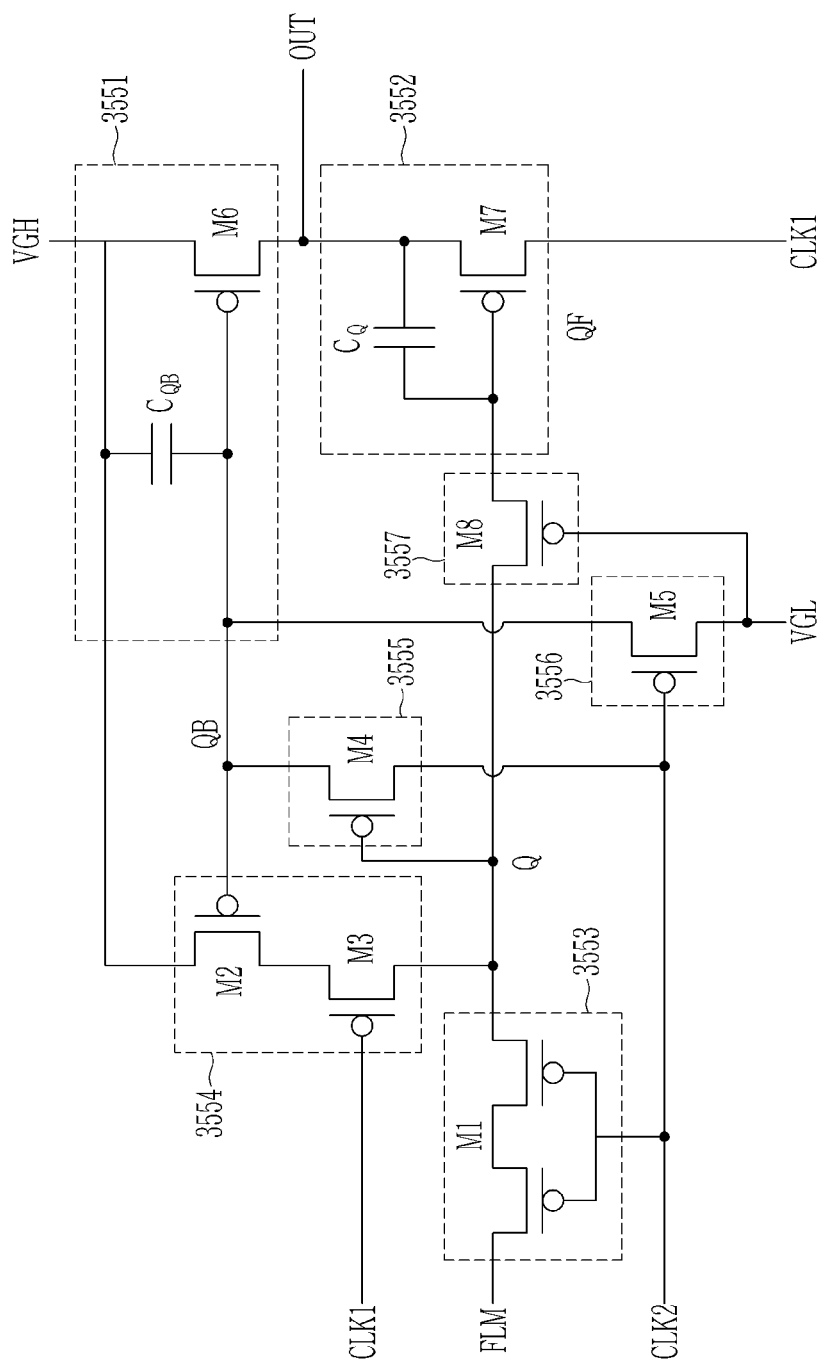
FIG. 26 is a circuit diagram showing one stage of a scan signal generating unit of a display device according to an exemplary embodiment.

FIG. 26 is a circuit diagram showing one stage of a scan signal generating unit of a display device according to an exemplary embodiment.

As shown in FIG. 26, a stage for each scan signal included in a scan signal generating unit of the display device according to an exemplary embodiment includes a pull-up circuit 3551, a pull-down circuit 3552, a first node first controller 3555, a first node second controller 3556, a second node first controller 3553, a second node second controller 3554, and a first connection part 3557.

The pull-up circuit 3551 is a part that outputs the high voltage VGH of the scan signal, and the pull-down circuit 3552 is a part that outputs the low voltage VGL of the scan signal. The pull-up circuit 3551 and the pull-down circuit 3552 are connected to the output terminal Out, and when the high voltage VGH is output from the pull-up circuit 3551, the pull-down circuit 3552 does not output, while when low voltage VGL is output from the pull-down circuit 3552, the pull-up circuit 3551 does not output.

The pull-up circuit 3551 is controlled according to the voltage of the first node QB, and the voltage of the first node QB is controlled by the first node first controller 3555 and the first node second controller 3556.

The pull-down circuit 3552 is controlled according to the voltage of the second node Q, and the voltage of the second node Q is controlled by the second node first controller 3553 and the second node second controller 3554. Specifically, the pull-down circuit 3552 is connected to the second node Q by the first connection part 3557 and then is controlled according to the voltage of the second/first node QF. However, since the eighth transistor M8 included in the first connection part 3557 receives the low voltage VGL through the control terminal, the turn on state is maintained, so the pull-down circuit 3552 is actually controlled according to the voltage of the second node Q.

The pull-up circuit 3551 includes a sixth transistor M6 and a first capacitor $C_{QB}$. The gate electrode of the sixth transistor M6 is connected to the first node QB, the input electrode is connected to the high voltage VGH terminal, and the output electrode is connected to the output terminal Out. As a result, when the voltage of the first node QB is the low voltage, the high voltage VGH is output to the output terminal Out, and when the voltage of the first node QB is the high voltage, the sixth transistor M6 is turned off and does not output. The high voltage VGH is applied to one terminal of the first capacitor $C_{QB}$, and the other terminal is connected to the first node QB, thereby serving to maintain the voltage of the first node QB.

The pull-down circuit 3552 includes a seventh transistor M7 and a second capacitor $C_Q$. The gate electrode of the seventh transistor M7 is connected to the second/first node QF, the input electrode is connected to the first input terminal to which the first clock signal CLK1 is applied, and the output electrode is connected to the output terminal Out. As a result, when the voltage of the second/first node QF is the low voltage, the voltage of the first clock signal CLK1 is output to the output terminal Out, and when the voltage of the second/first node QF is the high voltage, the seventh transistor M7 does not output. Here, in order for the second/first node QF to be a low voltage, the second node Q should be applied with the low voltage as a start signal FLM, and the low voltage applied to the second/first node QF is stored in the second capacitor $C_Q$ and the voltage of the first clock signal CLK1 is output to the output terminal Out. The eighth transistor M8 included in the first connection part 3557 receives the low voltage VGL through the control terminal, and the turn on state is maintained, so the voltage of the second/first node QF has the same voltage as the voltage of the second node Q. Therefore, the pull-down circuit 3552 is controlled by the second node (SR_Q). One terminal of the second capacitor $C_Q$ is connected to the output terminal Out, and the other terminal is connected to the second/first node QF, thereby serving to store and maintain the voltage of the second/first node QF.

The first node first controller 3555 and the first node second controller 3556 controlling the voltage of the first node QB are now described.

The first node first controller 3555 includes a fourth transistor M4. The gate electrode of the fourth transistor M4 is connected to the second node Q, the input electrode is connected to the first input terminal to which the second clock signal CLK2 is applied, and the output electrode is connected to the first node QB. As a result, it is controlled according to the voltage of the second node Q to change the voltage of the first node QB, and in the present exemplary embodiment, the voltage of the first node QB is changed to the high voltage of the clock signal.

The first node second controller 3556 includes a fifth transistor M5. The gate electrode of the fifth transistor M5 is connected to the first input terminal to which the second clock signal CLK2 is applied, the input electrode receives the low voltage VGL, and the output electrode is connected to the first node QB. As a result, the voltage of the first node QB is changed to the low voltage VGL according to the second clock signal CLK2 input to the first input terminal.

The second node first controller 3553 and the second node second controller 3554 that control the voltage of the second node Q are now described.

The second node first controller 3553 includes a first transistor M1. The gate electrode of the first transistor M1 is connected to the first input terminal to which the second clock signal CLK2 is applied, the input electrode is connected to the start signal input terminal (the input terminal to which the start signal FLM or the output of the stage for the scan signal of the previous stage is input), and the output electrode is connected to the second node Q. The first transistor M1 may consist of two transistors, the gate electrodes are equally connected to the first input terminal, the input electrode of one transistor is connected to the start signal input terminal, and the output electrode of the other transistor is connected to the second node Q, and the output electrode of one transistor and the input electrode of the other transistor may be connected to each other. As a result, according to the second clock signal CLK2 input to the first input terminal, the voltage of the second node Q is changed to the voltage input to the start signal input terminal.

The second node second controller 3554 includes a second transistor M2 and a third transistor M3. The gate electrode of the second transistor M2 is connected to the first node QB, the input electrode receives a high voltage VGH, and the output electrode is connected to the input electrode of the third transistor M3. The gate electrode of the third transistor M3 is connected to the second input terminal to which the first clock signal CLK1 is applied, the input electrode is connected to the output electrode of the second transistor M2, and the output electrode is connected to the second node Q. As a result, when the first node QB is the low voltage and the first clock signal CLK1 is the low voltage, the second node Q is changed to the high voltage VGH. Accordingly, when the first node QB is the low voltage VGL, the voltage of the second node Q has a high voltage VGH value.

The sixth transistor M6 and the seventh transistor M7 are buffer transistors requiring an increase in the on-current, and may include a relatively thin insulating layer. For example, the sixth transistor M6 and the seventh transistor M7 may have a structure similar to that of the third transistor of each pixel described above. That is, the first gate insulating layer may be positioned between the gate electrode and the channel of the sixth transistor M6 and between the gate electrode and the channel of the seventh transistor M7.

The second transistor M2, the fourth transistor M4, the fifth transistor M5, and the eighth transistor T8 are transistors that require a reliability improvement and may include a relatively thick insulating layer. For example, the second transistor M2, the fourth transistor M4, the fifth transistor M5, and the eighth transistor T8 may have a structure similar to the driving transistor of each pixel described above. That is, the first gate insulating layer and the second gate insulating layer may be positioned between the gate electrode and the channel of the second transistor M2, between the gate electrode and the channel of the fourth transistor M4, between the gate electrode and the channel of the fifth transistor M5, and between the gate electrode and the channel of the eighth transistor TR8.

The second capacitor CQ may have a structure in which an insulating layer is positioned between the electrode made of the first gate conductor and the electrode made of the second gate conductor. That is, the second capacitor CQ may have a structure of a metal layer-insulating layer-metal layer (MIM). The first capacitor CQB may have a structure in which an insulating layer is positioned between an electrode made of the second gate conductor and a region made of the semiconductor layer. That is, the first capacitor CQB may have a structure of a metal layer-insulating layer-semiconductor layer (MIS).

While this disclosure has been described in connection with what is presently considered to be practical exemplary embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
    a substrate;
    a semiconductor layer disposed on the substrate and including a channel, a first region, and a second region of a driving transistor, and a channel, a first region, and a second region of a second transistor;
    a first gate insulating layer disposed on the semiconductor layer;
    a gate electrode of the second transistor disposed on the first gate insulating layer and overlapping the channel of the second transistor;
    a second gate insulating layer disposed on the gate electrode of the second transistor; and
    a gate electrode of the driving transistor disposed on the second gate insulating layer and overlapping the channel of the driving transistor,
    wherein the driving transistor includes a first driving transistor and a second driving transistor serially connected to each other, each of the first driving transistor and the second driving transistor including a gate electrode, a channel, a first region and a second region, and
    wherein the second gate insulating layer is disposed between the gate electrode of the first driving transistor and the channel of the first driving transistor, and is not disposed between the gate electrode of the second driving transistor and the channel of the second driving transistor, and between the gate electrode of the second transistor and the channel of the second transistor.

2. The display device of claim 1, wherein the driving transistor include a first driving transistor and a second driving transistor serially connected to each other, each of the first driving transistor and the second driving transistor including a gate electrode, a channel, a first region and a second region, and
    wherein a thickness of a gate insulating layer disposed between the gate electrode of the second driving transistor and the channel of the second driving transistor is less than a thickness of a gate insulating layer disposed between the gate electrode of the first driving transistor and the channel of the first driving transistor.

3. The display device of claim 2, wherein a thickness of a gate insulating layer disposed between the gate electrode of the second transistor and the channel of the second transistor is less than the thickness of the gate insulating layer disposed between the gate electrode of the first driving transistor and the channel of the first driving transistor.

4. The display device of claim 3, wherein the thickness of the gate insulating layer disposed between the gate electrode of the second transistor and the channel of the second transistor is the same as the thickness of the gate insulating layer disposed between the gate electrode of the second driving transistor and the channel of the second driving transistor.

5. The display device of claim 1, wherein the first gate insulating layer includes a lower first gate insulating layer disposed on the semiconductor layer and an upper first gate insulating layer disposed on the lower first gate insulating layer.

6. The display device of claim 5, wherein the upper first gate insulating layer and the second gate insulating layer include the same material.

7. The display device of claim 6, wherein the lower first gate insulating layer includes a silicon oxide and the upper first gate insulating layer and the second gate insulating layer include a silicon nitride.

8. The display device of claim 6, wherein the upper first gate insulating layer and the second gate insulating layer are formed through different process conditions.

9. The display device of claim 5, wherein a thickness of the upper first gate insulating layer is thinner than a thickness of the lower first gate insulating layer.

10. The display device of claim 9, wherein the ratio of the thickness of the upper first gate insulating layer to the thickness of the lower first gate insulating layer is 0.2 or more and 0.8 or less.

11. The display device of claim 1, wherein the thickness of the equivalent oxide film of the first gate insulating layer is 800 Å or more and 1400 Å or less.

12. The display device of claim 11, wherein the thickness of the second gate insulating layer is 1200 Å or more and 1800 Å or less.

13. The display device of claim 1, wherein the driving transistor include a first driving transistor and a second driving transistor serially connected to each other, each of the first driving transistor and the second driving transistor including a gate electrode, a channel, a first region and a second region,
    wherein the display device further comprising:
    a first storage electrode connected to the gate electrode of the second driving transistor;
    a second storage electrode disposed on the second gate insulating layer and overlapping the first storage electrode; and
    a third storage electrode disposed on the second gate insulating layer and overlapping the gate electrode of the second driving transistor, and
    wherein the semiconductor layer further includes a capacitor region overlapping the first storage electrode.

14. The display device of claim 13, wherein the first storage electrode is disposed on the same layer as the gate electrode of the second driving transistor and the second storage electrode and the third storage electrode are disposed on the same layer and are formed integrally.

15. The display device of claim 13, wherein the channel, the first region, and the second region of the first driving transistor, the channel, the first region, and the second region of the second driving transistor, and the channel, the first region, and the second region of the second transistor are integrally formed and separated from the capacitor region.

16. The display device of claim 13, further comprising:
    an interlayer insulating layer disposed on the second storage electrode and the third storage electrode; and
    a driving voltage line and a connection electrode disposed on the interlayer insulating layer,
    wherein the driving voltage line is connected to the second storage electrode, the third storage electrode, and the capacitor region, and the connection electrode is connected to the gate electrode of the first driving transistor and the gate electrode of the second driving transistor.

17. A display device comprising:

a substrate;

a semiconductor layer disposed on the substrate and including a channel, a first region, and a second region of a driving transistor, and a channel, a first region, and a second region of a second transistor;

a first gate insulating layer disposed on the semiconductor layer;

a gate electrode of the second transistor disposed on the first gate insulating layer and overlapping the channel of the second transistor;

a second gate insulating layer disposed on the gate electrode of the second transistor; and a gate electrode of the driving transistor disposed on the second gate insulating layer and overlapping the channel of the driving transistor, wherein the driving transistor includes a first driving transistor and a second driving transistor serially connected to each other, each of the first driving transistor and the second driving transistor including a gate electrode, a channel, a first region and a second region, and wherein the second gate insulating layer is disposed between the gate electrode of the first driving transistor and the channel of the first driving transistor, and is not disposed between the gate electrode of the second driving transistor and the channel of the second driving transistor, and between the gate electrode of the second transistor and the channel of the second transistor.

18. The display device of claim 17, further comprising:

a third gate insulating layer disposed on the gate electrode of the driving transistor; and a storage electrode disposed on the third gate insulating layer and overlapping the gate electrode of the driving transistor, wherein a thickness of a gate insulating layer disposed between the gate electrode of the second transistor and the channel of the second transistor is less than a thickness of a gate insulating layer disposed between the gate electrode of the driving transistor and the channel of the driving transistor.

19. The display device of claim 17, wherein the first gate insulating layer includes a lower first gate insulating layer disposed on the semiconductor layer, and an upper first gate insulating layer disposed on the lower first gate insulating layer, and wherein the upper first gate insulating layer and the second gate insulating layer include the same material.

* * * * *